United States Patent
Muraki

(10) Patent No.: US 6,864,488 B2
(45) Date of Patent: Mar. 8, 2005

(54) CHARGED PARTICLE BEAM EXPOSURE METHOD AND APPARATUS

(75) Inventor: Masato Muraki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/339,284

(22) Filed: Jan. 10, 2003

(65) Prior Publication Data

US 2003/0107006 A1 Jun. 12, 2003

Related U.S. Application Data

(62) Division of application No. 09/422,096, filed on Oct. 20, 1999, now Pat. No. 6,559,456.

(30) Foreign Application Priority Data

| Oct. 23, 1998 | (JP) | 10-302204 |
| Oct. 23, 1998 | (JP) | 10-302205 |
| Nov. 17, 1998 | (JP) | 10-326605 |

(51) Int. Cl.⁷ .......................... G01N 23/00; G21K 5/10; G21K 7/00
(52) U.S. Cl. .................. 250/442.11; 250/310; 250/311
(58) Field of Search ........................ 250/442.11, 311, 250/310, 492.2, 492.1, 492.21

(56) References Cited

U.S. PATENT DOCUMENTS

| 4,583,298 A | * | 4/1986 | Raugh ........................ 33/502 |
| 4,728,799 A | * | 3/1988 | Gordon et al. ........... 250/492.2 |
| 4,763,004 A | * | 8/1988 | Yasuda et al. .......... 250/396 R |
| 5,004,340 A | * | 4/1991 | Tullis et al. ............. 356/243.6 |
| 5,043,586 A | * | 8/1991 | Giuffre et al. ........... 250/491.1 |
| 5,169,488 A | * | 12/1992 | Giuffre et al. ................ 216/39 |
| 5,271,796 A | * | 12/1993 | Miyashita et al. ............. 438/16 |
| 5,383,018 A | * | 1/1995 | Sadjadi ..................... 356/243.4 |
| 5,747,816 A | | 5/1998 | Kurosaki ................. 250/491.1 |
| 6,127,683 A | * | 10/2000 | Sasaki et al. ................ 250/310 |
| 6,246,204 B1 | * | 6/2001 | Ebihara et al. ............. 318/649 |
| 6,509,564 B1 | * | 1/2003 | Suzuki et al. ................ 250/310 |
| 6,567,168 B2 | * | 5/2003 | Nara et al. .................. 356/394 |
| 6,586,952 B2 | * | 7/2003 | Nozoe et al. ................ 324/751 |
| 6,593,152 B2 | * | 7/2003 | Nakasuji et al. .............. 438/14 |
| 6,700,122 B2 | * | 3/2004 | Matsui et al. ............... 250/310 |
| 6,703,850 B2 | * | 3/2004 | Nozoe et al. ................ 324/751 |

FOREIGN PATENT DOCUMENTS

| JP | 63-232912 | 9/1988 |
| JP | 2-212624 | 8/1990 |

* cited by examiner

Primary Examiner—John R. Lee
Assistant Examiner—Kalimah Fernandez
(74) Attorney, Agent, or Firm—Fitzpatrick, Cella, Harper & Scinto

(57) ABSTRACT

An exposure method of drawing a pattern on a substrate using a charged particle beam. The method includes a detection step of placing a calibration substrate having a plurality of marks on a stage and detecting positions of the plurality of marks by a first position detection section using a charged particle beam and by a second position detection section using light while adjusting a position of the stage, and a correction step of correcting a position where the charged particle beam is incident on the substrate on which the pattern is to be drawn in drawing, in accordance with the position of the stage on the basis of the difference between detection results by the charged particle beam and the light in the detection step.

24 Claims, 16 Drawing Sheets

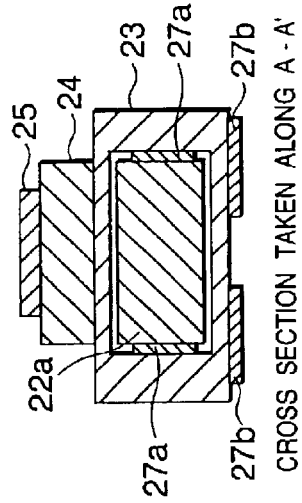
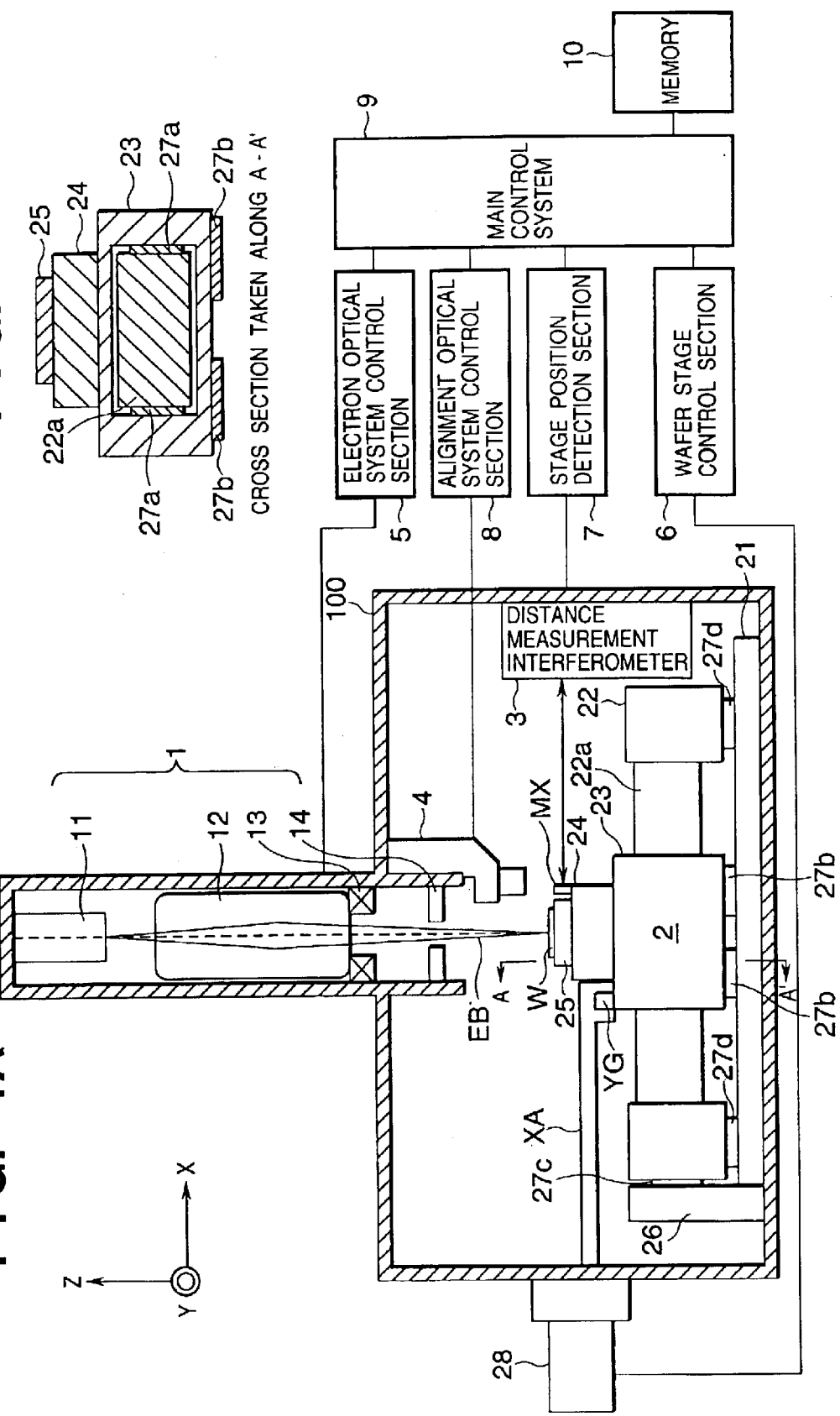

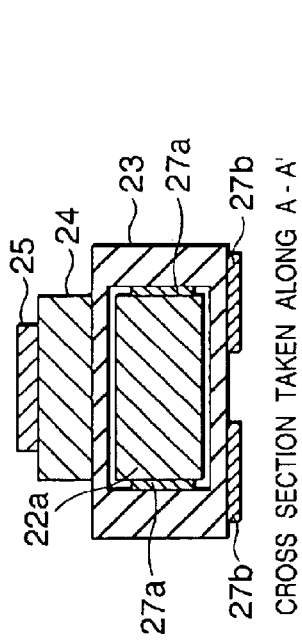
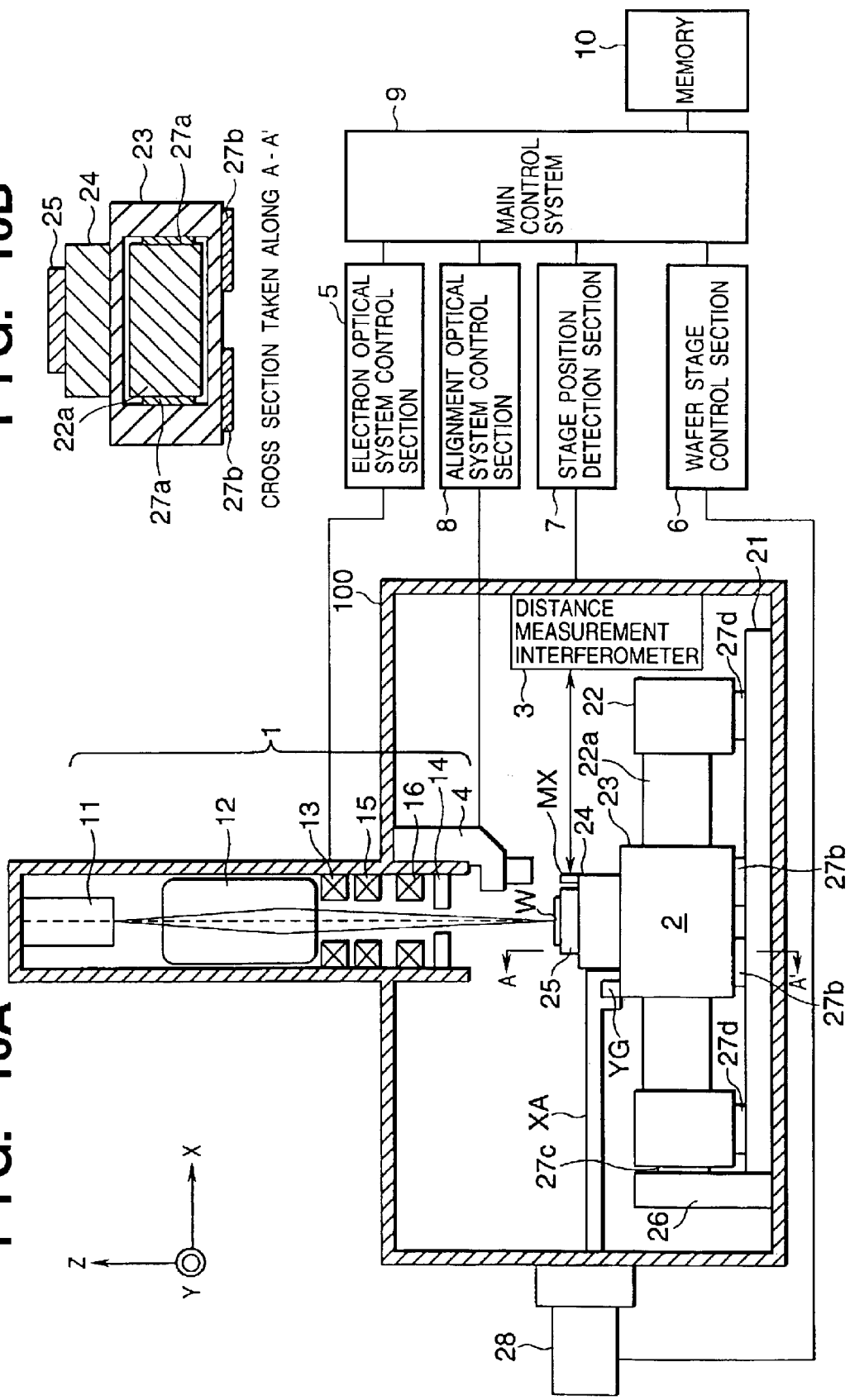

SEMICONDUCTOR DEVICE MANUFACTURING FLOW

WAFER PROCESS

CHARGED PARTICLE BEAM EXPOSURE METHOD AND APPARATUS

This application is a divisional application of application Ser. No. 09/422,096, filed Oct. 20, 1999, now U.S. Pat. No. 6,559,456.

BACKGROUND OF THE INVENTION

1. Field of the Invention

The present invention relates to an exposure method and apparatus which draw a pattern on a substrate such as a wafer or glass plate using a charged particle beam such as an electron beam or an ion beam.

2. Description of the Related Art

Electron beam exposure apparatuses are roughly classified into apparatuses for scanning a point beam on a wafer to draw a pattern and apparatuses for shaping an electron beam into a desired shape using a mask and transferring the mask pattern on a wafer. In both apparatuses, to expose a pattern on the entire wafer surface, the stage on which the wafer is placed must be moved to move the wafer relative to the electron beam.

In such a conventional apparatus, however, as the stage moves, the position of the electron beam changes accordingly, and the pattern cannot be drawn or transferred to the desired position on the wafer. This is probably because the electromagnetic field near the electron beam varies during movement of the stage. Especially, when a magnetic material is used for the stage which moves, the position of the electron beam conspicuously changes during movement of the stage.

Particularly, since the position of the electron beam changes during movement of the stage, the imaging characteristics (e.g., the focus position or astigmatic amount) of the electron beam may vary, and the pattern cannot be drawn or transferred to the desired position on the wafer. This is probably because the electromagnetic field near the electron beam varies during movement of the stage. Especially, when a magnetic material is used for the stage which moves, the imaging characteristics (e.g., the focus position or astigmatic amount) of the electron beam conspicuously vary during movement of the stage.

SUMMARY OF THE INVENTION

It is the object of the first and second aspects of the present invention to, e.g., suppress degradation in drawing accuracy due to a change in position of a charged particle beam during movement of a stage.

According to the first aspect of the present invention, there is provided an exposure method of placing a substrate on a stage and drawing a pattern on the substrate using a charged particle beam, comprising the correction step of correcting a position where the charged particle beam is incident on the substrate in drawing, in accordance with a position of the stage.

In the exposure method according to the first aspect of the present invention, for example, the correction step preferably comprises controlling a deflector for deflecting the charged particle beam to correct the position where the charged particle beam is incident on the substrate in drawing.

In the exposure method according to the first aspect of the present invention, for example, the correction step preferably comprises controlling the position of the stage to correct the position where the charged particle beam is incident on the substrate in drawing.

In the exposure method according to the first aspect of the present invention, for example, the correction step preferably comprises correcting a shift of the position where the charged particle beam is incident on the substrate, the shift being generated in accordance with the position of the stage.

In the exposure method according to the first aspect of the present invention, for example, the correction step preferably comprises correcting a reference position of the charged particle beam on the substrate in accordance with the position of the stage to correct the position where the charged particle beam is incident on the substrate in drawing.

In the exposure method according to the first aspect of the present invention, for example, the reference position is preferably a position where the charged particle beam is incident on the substrate without being deflected by a deflector.

In the exposure method according to the first aspect of the present invention, preferably, for example, the method further comprises the drawing step of drawing the pattern in each of a plurality of shot regions on the substrate, and the correction step comprises continuously correcting the position where the charged particle beam is incident on the substrate, in accordance with the position of the stage while the pattern is being drawn in each shot region.

In the exposure method according to the first aspect of the present invention, preferably, for example, the method further comprises the drawing step of drawing the pattern in each of a plurality of shot regions on the substrate while moving the stage to switch the shot region where the pattern is to be drawn, and the correction step comprises correcting the position where the charged particle beam is incident on the substrate, in accordance with a position of the shot region where the pattern is to be drawn.

In the exposure method according to the first aspect of the present invention, preferably, for example, the method further comprises the check step of checking a relationship between the position of the stage and the position where the charged particle beam is incident on the substrate, and the correction step comprises correcting the position where the charged particle beam is incident on the substrate in drawing, on the basis of a check result in the check step.

In the exposure method according to the first aspect of the present invention, for example, the check step preferably comprises checking a shift of the position where the charged particle beam is incident on the substrate, the shift being generated in accordance with the position of the stage.

In the exposure method according to the first aspect of the present invention, for example, the check step preferably comprises the placing step of placing a calibration substrate on the stage, the drawing step of drawing a calibration pattern on the calibration substrate, the detection step of detecting a position of the calibration pattern drawn in the drawing step, and the calculation step of calculating the difference between the position of the calibration pattern detected in the detection step and a designed position of the calibration pattern.

In the exposure method according to the first aspect of the present invention, preferably, for example, the drawing step comprises drawing the pattern using, as a target position, a designed reference position of the charged particle beam on the substrate, and the calculation step comprises calculating the difference between an actual reference position as the position of the pattern detected in the detection step and the designed reference position.

In the exposure method according to the first aspect of the present invention, for example, the correction step preferably comprises correcting the position where the charged particle beam is incident on the substrate in drawing such that the actual reference position matches the designed reference position.

In the exposure method according to the first aspect of the present invention, preferably, for example, the calibration substrate placed on the stage in the placing step is coated with a resist, the method further comprises the development step of developing the calibration substrate after the drawing step, and the detection step comprises detecting a position of a pattern formed in the development step.

In the exposure method according to the first aspect of the present invention, for example, the stage contains a magnetic material.

In the exposure method according to the first aspect of the present invention, for example, the stage is supported by static pressure bearings and a preloading mechanism.

In the exposure method according to the first aspect of the present invention, for example, the preloading mechanism comprises a magnetic preloading mechanism, a vacuum preloading mechanism, or an electrostatic preloading mechanism.

In the exposure method according to the first aspect of the present invention, for example, the charged particle beam is an electron beam.

According to the second aspect of the present invention, there is provided an exposure apparatus for drawing a pattern on a substrate using a charged particle beam, comprising a charged particle beam source for generating the charged particle beam, a stage which moves while having the substrate placed on the stage, and a correction section for correcting a position where the charged particle beam is incident on the substrate in drawing, in accordance with a position of the stage.

In the exposure apparatus according to the second aspect of the present invention, preferably, for example, the apparatus further comprises a deflector for deflecting the charged particle beam generated by the charged particle beam source, and the correction section controls the deflector to correct the position where the charged particle beam is incident on the substrate in drawing.

It is the object of the third and fourth aspects of the present invention to, e.g., suppress degradation in drawing accuracy due to a variation in position of a charged particle beam during movement of a stage.

According to the third aspect of the present invention, there is provided an exposure method of drawing a pattern on a substrate using a charged particle beam, comprising the detection step of placing a calibration substrate having a plurality of marks on a stage and detecting positions of the plurality of marks by a first position detection section using a charged particle beam and by a second position detection section using light while adjusting a position of the stage, and the correction step of correcting a position where the charged particle beam is incident on the substrate on which the pattern is to be drawn in drawing, in accordance with the position of the stage on the basis of the difference between detection results by the charged particle beam and the light in the detection step.

In the exposure method according to the third aspect of the present invention, for example, the charged particle beam used in the detection step and the charged particle beam for drawing the pattern on the substrate on which the pattern is to be drawn are preferably generated by the same electron optical system.

In the exposure method according to the third aspect of the present invention, preferably, for example, the method further comprises the determination step of detecting a position of a reference mark formed on the stage by the first position detection section using the charged particle beam and the second position detection section using the light to determine the positional relationship between a reference position of the first position detection section and a reference position of the second position detection section, and the correction step comprises correcting a reference position of the charged particle beam in accordance with the position of the stage on the basis of the difference between the detection results by the charged particle beam and the light in the detection step such that the positional relationship between the reference position of the charged particle beam incident on the substrate on which the pattern is to be drawn in drawing and the reference position of the second position detection section matches the positional relationship between the reference position of the first position detection section and the reference position of the second position detection section.

In the exposure method according to the third aspect of the present invention, for example, the correction step preferably comprises obtaining, on the basis of the position of the stage and the detection result by the charged particle beam and that by the light, the relationship between the position of the stage and a shift of the position where the charged particle beam is incident on the substrate from a target position and correcting the position where the charged particle beam is incident on the substrate on which the pattern is to be drawn in drawing, on the basis of the relationship in accordance with the position of the stage.

In the exposure method according to the third aspect present invention, for example, the correction step preferably comprises controlling a deflector for deflecting the charged particle beam to correct the position where the charged particle beam is incident on the substrate on which the pattern is to be drawn in drawing.

In the exposure method according to the third aspect of the present invention, for example, the correction step preferably comprises controlling the position of the stage to correct the position where the charged particle beam is incident on the substrate on which the pattern is to be drawn in drawing.

In the exposure method according to the third aspect of the present invention, for example, the correction step preferably comprises correcting a shift of the position where the charged particle beam is incident on the substrate on which the pattern is to be drawn, the shift being generated in accordance with the position of the stage.

In the exposure method according to the third aspect of the present invention, for example, the correction step preferably comprises correcting a reference position of the charged particle beam on the substrate in accordance with the position of the stage to correct the position where the charged particle beam is incident on the substrate on which the pattern is to be drawn in drawing.

In the exposure method according to the third aspect of the present invention, for example, the reference position is preferably a position where the charged particle beam is incident on the substrate on which the pattern is to be drawn without being deflected by a deflector.

In the exposure method according to the third aspect of the present invention, preferably, for example, the method further comprises the drawing step of drawing the pattern in each of a plurality of shot regions on the substrate on which the pattern is to be drawn, and the correction step comprises continuously correcting the position where the charged particle beam is incident on the substrate on which the pattern is to be drawn, in accordance with the position of the stage while the pattern is being drawn in each shot region.

In the exposure method according to the third aspect of the present invention, preferably, for example, the method further comprises the drawing step of drawing the pattern in each of a plurality of shot regions on the substrate on which the pattern is to be drawn while moving the stage to switch the shot region where the pattern is to be drawn, and the correction step comprises correcting the position where the charged particle beam is incident on the substrate on which the pattern is to be drawn, in accordance with a position of the shot region where the pattern is to be drawn In the exposure method according to the third aspect of the present invention, for example, the stage contains a magnetic material.

In the exposure method according to the third aspect of the present invention, for example, the stage is supported by static pressure bearings and a preloading mechanism.

In the exposure method according to the third aspect of the present invention, for example, the preloading mechanism comprises a magnetic preloading mechanism, a vacuum preloading mechanism, or an electrostatic preloading mechanism.

In the exposure method according to the third aspect of the present invention, for example, the charged particle beam is an electron beam.

According to the fourth aspect of the present invention, there is provided an exposure apparatus for drawing a pattern on a substrate using a charged particle beam, comprising a stage which moves while having the substrate placed on the stage, an electron optical system having a function of drawing the pattern on the substrate using the charged particle beam and a function of irradiating a mark with the charged particle beam and detecting a position of the mark on the basis of the charged particle beam from the mark, an alignment optical system for irradiating a mark with light and detecting a position of the mark on the basis of light from the mark, and a control section, the control section controlling processing including the detection step of, while a calibration substrate having a plurality of marks is placed on the stage, detecting positions of the plurality of marks by the electron optical system and by the alignment optical system while adjusting a position of the stage, and the correction step of correcting a position where the charged particle beam is incident on the substrate on which the pattern is to be drawn in drawing, in accordance with the position of the stage on the basis of the difference between detection results by the charged particle beam and the light in the detection step.

It is the object of the fifth and sixth aspects of the present invention to, e.g., suppress degradation in drawing accuracy due to a variation in position of a charged particle beam during movement of a stage and, more particularly, suppress degradation in drawing accuracy due to a variation in imaging characteristics of a charged particle beam during movement of the stage.

According to the fifth aspect of the present invention, there is provided an exposure method of placing a substrate on a stage and drawing a pattern on the substrate using a charged particle beam, comprising the correction step of correcting imaging characteristics of the charged particle beam in accordance with a position of the stage.

In the exposure method according to the fifth aspect of the present invention, for example, the imaging characteristics of the charged particle beam corrected in the correction step preferably include a focus position.

In the exposure method according to the fifth aspect of the present invention, for example, the imaging characteristics of the charged particle beam corrected in the correction step preferably include an astigmatic amount.

In the exposure method according to the fifth aspect, of the present invention, for example, the correction step preferably comprises adjusting at least one of a dynamic stigmatic coil and a dynamic focus coil to correct the imaging characteristics of the charged particle beam.

In the exposure method according to the fifth aspect of the present invention, preferably, for example, the method further comprises the check step of checking the relationship between the position of the stage and the imaging characteristics of the charged particle beam, and the correction step comprises correcting the imaging characteristics of the charged particle beam in accordance with the position of the stage on the basis of a check result in the check step.

In the exposure method according to the fifth aspect of the present invention, for example, the check step preferably comprises checking the imaging characteristics of the charged particle beam at each of a plurality of positions of the stage while sequentially moving the stage to the plurality of positions.

In the exposure method according to the fifth aspect of the present invention, for example, the check step preferably comprises the steps of placing a calibration substrate having a plurality of marks on the stage, and observing images of the marks while moving the stage in accordance with the positions of the marks to obtain the imaging characteristics of the charged particle beam in accordance with the position of the stage.

In the exposure method according to the fifth aspect of the present invention, for example, the stage contains a magnetic material.

In the exposure method according to the fifth aspect of the present invention, for example, the stage is supported by static pressure bearings and a preloading mechanism.

In the exposure method according to the fifth aspect of the present invention, for example, the preloading mechanism comprises a magnetic preloading mechanism, a vacuum preloading mechanism, or an electrostatic preloading mechanism.

In the exposure method according to the fifth aspect of the present invention, for example, the charged particle beam is an electron beam.

According to the sixth aspect of the present invention, there is provided an exposure apparatus for drawing a pattern on a substrate using a charged particle beam, comprising a charged particle beam source for generating the charged particle beam, a stage which moves while having the substrate placed on the stage, and a correction section for correcting imaging characteristics of the charged particle beam in accordance with a position of the stage.

It is the object of the seventh to ninth aspects of the present invention to prevent degradation in drawing accuracy due to a change in position of a charged particle beam during movement of a stage and to allow manufacture of an accurate device.

According to the seventh aspect of the present invention, there is provided a device manufacturing method comprising the steps of placing a substrate on a stage of a charged particle beam exposure apparatus and drawing a pattern on the substrate using a charged particle beam while correcting a position where the charged particle beam is incident on the substrate, in accordance with a position of the stage, and developing the substrate on which the pattern is drawn.

According to the eighth aspect of the present invention, there is provided a device manufacturing method comprising the steps of placing a calibration substrate having a plurality of marks on a stage and detecting positions of the plurality of marks by a first position detection section using a charged particle beam and a second position detection section using light while adjusting a position of the stage, drawing a pattern on a substrate on which the pattern is to be drawn using a charged particle beam while correcting a position where the charged particle beam is incident on the substrate in drawing, in accordance with a position of the stage on the basis of the difference between detection results by the charged particle beam and the light in the detection step, and developing the substrate on which the pattern is drawn.

According to the ninth aspect of the present invention, there is provided a device manufacturing method comprising the steps of placing a substrate on a stage of a charged particle beam exposure apparatus and drawing a pattern on the substrate while correcting imaging characteristics of a charged particle beam in accordance with a position of the stage, and developing the substrate on which the pattern is drawn.

Further objects, features and advantages of the present invention will become apparent from the following detailed description of the embodiments of the present invention with reference to the accompanying drawings.

BRIEF DESCRIPTION OF THE DRAWINGS

FIGS. 1A and 1B are views showing the arrangement of an electron beam exposure apparatus according to the first embodiment of the present invention;

FIGS. 10A and 10B are views showing the arrangement of an electron beam exposure apparatus according to the second embodiment of the present invention;

DETAILED DESCRIPTION OF THE PREFERRED EMBODIMENTS

[First Embodiment]

Figure 2:
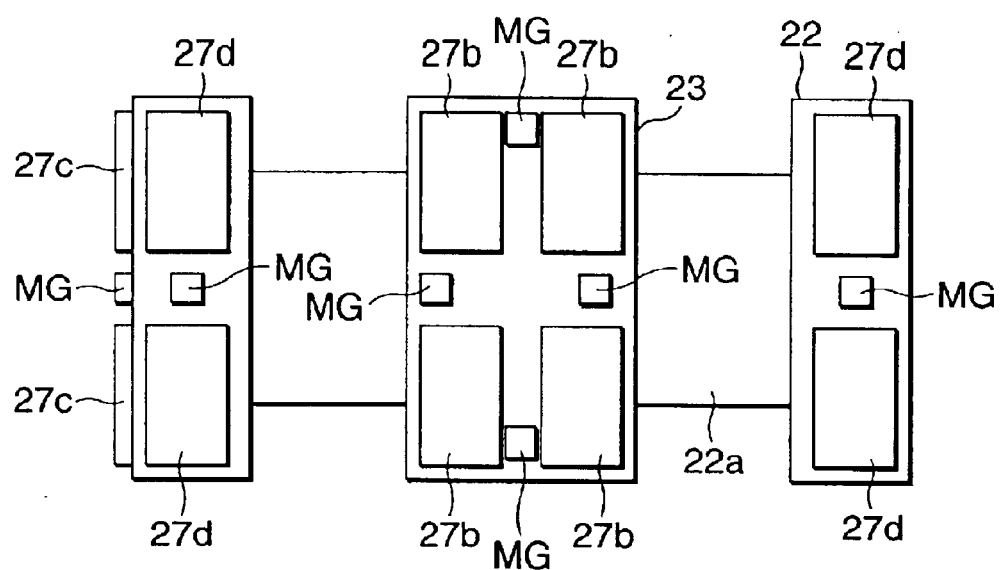
FIG. 2 is a view of a stage when viewed from the lower side.

In this embodiment, an electron beam exposure apparatus using an electron beam will be described as an example of a charged particle beam exposure apparatus. The present invention can also be applied to an exposure apparatus using, e.g., an ion beam as a charged particle beam.

FIGS. 1A and 1B are views showing the arrangement of the electron beam exposure apparatus according to the first embodiment of the present invention.

Referring to FIGS. 1A and 1B, a vacuum chamber 100 is vacuum-evacuated by a vacuum pump (not shown). The vacuum chamber 100 incorporates an electron optical system 1, a wafer stage 2, a distance measurement interferometer 3, an alignment optical system 4, and the like.

The electron optical system 1 has an electron gun 11 for emitting an electron beam, and electron lens system 12 for focusing an electron beam EB from the electron gun 11, a deflector 13 for deflecting the electron beam EB, and an electron detection system 14 for detecting electrons generated when a wafer W is irradiated with the electron beam EB. The constituents of the electron optical system are controlled by an electron optical system control section 5. The position where the electron beam from the electron optical system 1 is incident on the stage side without being deflected by the deflector 13 is used as the electron beam reference position. To expose the wafer with the electron beam EB, the electron optical system control section 5 causes the electron beam EB to scan via the deflector 13 with reference to the reference position and control irradiation with the electron beam EB in accordance with the pattern to be drawn. To detect the position of the wafer W using the electron beam EB, the electron optical system control section 5 causes the electron beam EB to scan on the wafer W via the deflector 13 and detects electrons from the wafer W using the electron detection system 14, thereby detecting the position of the wafer W with respect to the reference position.

The wafer stage 2 will be described next. Reference numeral 21 denotes a stage base plate having a reference surface; 22, a Y stage; and 23, an X stage. A θ-Z stage 24 is mounted on the X stage 23. An electrostatic chuck 25 for chucking and fixing the wafer W and mirrors MX and MY (MY is not shown) for the distance measurement interferometer 3 are mounted on the θ-Z stage 24. Reference numeral 26 denotes a fixed guide in the horizontal direction (Y-axis direction) of the Y stage 22. Each of static pressure pneumatic bearings 27a, 27b, 27c, and 27d has a porous pad (ceramic pad) for supplying a gas and a labyrinth partition for preventing outflow of the gas to cope with the vacuum, as proposed in Japanese Patent Laid-Open No. 2-212624. The static pressure pneumatic bearing 27a (FIG. 1B taken along a line A–A') guides the X stage 23 in the horizontal direction (Y-axis direction). The static pressure pneumatic bearing 27b guides the X stage 23 in the vertical direction (Z-axis direction). The static pressure pneumatic bearing 27c guides the Y stage 22 in the horizontal direction. The static pressure pneumatic bearing 27d guides the Y stage 22 in the vertical direction.

FIG. 2 is a view showing the lower surfaces of the Y stage 22 and the X stage 23. Referring to FIG. 2, reference symbols MG denote preloading magnet units. As proposed in Japanese Patent Laid-Open No. 63-232912, when the moving bodies 22 and 23 are floated from the reference surface of the stage base plate 21 by supplying a pressurizing fluid to the static pressure bearings by a preloading mechanism (mechanism for chucking the moving bodies 22 and 23) having, as a magnetic force unit, a permanent magnet and yokes (magnetic material) provided on both sides of the magnet, the preloading magnet units MG prevent the moving bodies 22 and 23 from tilting due to the variation on the characteristics of the bearings and always maintain a predetermined posture with respect to the reference surface of the stage base plate 21. Except for a guide plate 22a in the horizontal direction of the X stage 23, the surfaces of the Y stage 22 and X stage 23 are covered with a magnetic shielding material (e.g., Permalloy) to reduce the influence of the magnetic field from the preloading magnet units on the electron beam. In this embodiment, as the preloading mechanism for providing a chucking force between the stages 22 and 23 and the reference surface of the surface plate 21 to apply preloading, a magnetic preloading mechanism is employed. However, the present invention is not limited to this. A vacuum preloading mechanism for applying preloading by vacuum chucking or an electrostatic preloading mechanism for applying preloading by an electrostatic force may be employed.

Figure 3:
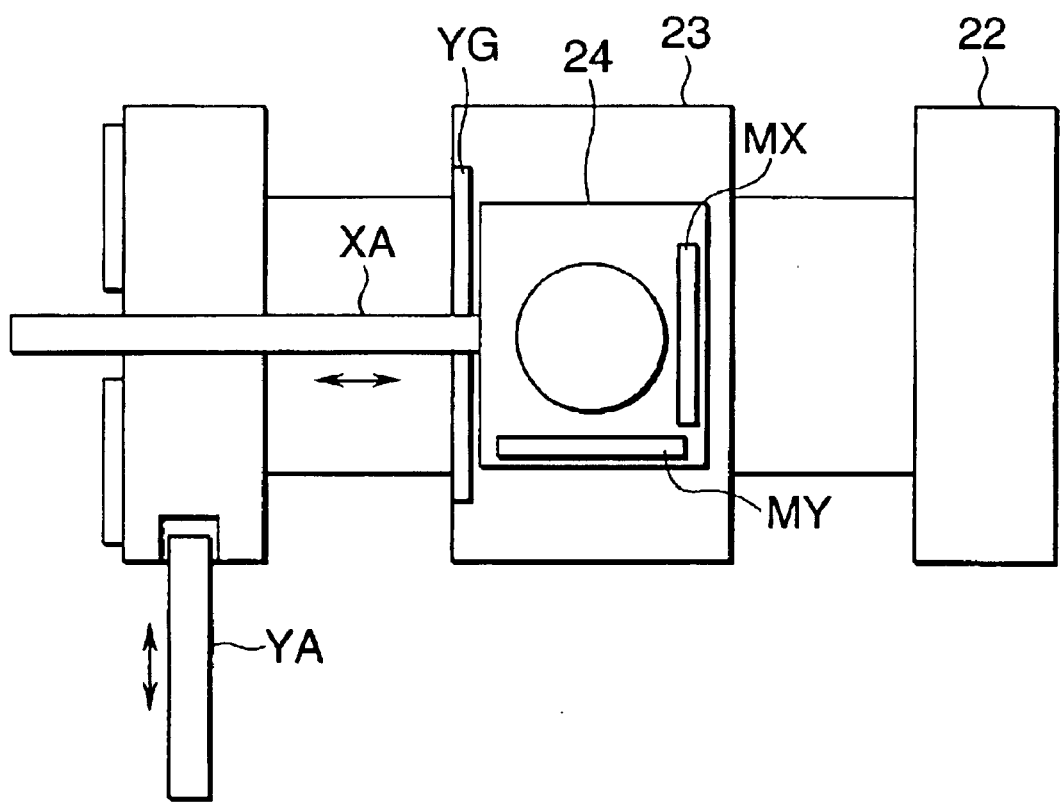
FIG. 3 is a view of the stage when viewed from the upper side.

FIG. 3 is a plan view showing the upper surfaces of the Y stage 22 and X stage 23. Referring to FIG. 3, the X stage 23 is driven by an arm XA extending/contracting in the X direction. Referring back to FIG. 1A, the distal end of the arm XA is coupled with the X stage 23 via a Y guide rail YG fixed to the X stage 23 so as not to impede the X stage 23 from moving in the Y direction. The arm XA is driven by an X actuator 28 fixed to the vacuum chamber 100 to extend/contract in the X direction. The Y stage 22 is coupled to an arm YA which is extended/contracted by a Y actuator (not shown), and driven by the arm YA. The X actuator 28 and Y actuator are controlled by a wafer stage control section 6.

When a gas is supplied to the static pressure pneumatic bearings 27c and 27d, the Y stage 22 is floated from the stage base plate 21 and moved by the Y actuator in the Y direction along the fixed guide 26 provided on one side. When a gas is supplied to the static pressure pneumatic bearings 27a and 27b, the X stage 23 is floated from the stage base plate 21, like the Y stage 22, and moved by the X actuator 28 in the X direction using the side surface 22a of the Y stage 22 as a guide in the horizontal direction. At this time, the X stage 23 and Y stage 22 are adjusted by the plurality of preloading magnet units MG to always have predetermined postures.

The distance measurement interferometer 3 splits a laser beam emitted from an internal laser source into a distance measurement beam and a reference beam. The mirror MX on the wafer stage 2 is irradiated with the distance measurement beam. The distance measurement beam is reflected by the mirror MX and returns into the distance measurement interferometer 3. The reference beam is reflected by an internal reference mirror. The intensity signal of interference light of the two returned beams is detected. The emitted distance measurement beam and reference beam have frequencies different from each other by a small amount $\Delta f$ when they are emitted. Hence, a signal whose frequency changes from $\Delta f$ in accordance with the moving speed of the mirror MX in the X direction is output. A stage position detection section 7 processes this intensity signal. With this processing, the change amount of the optical path length of the distance measurement beam with reference to the optical path length of the reference beam, i.e., the X-coordinate of the mirror MX fixed on the wafer stage is accurately measured at a high resolution with reference to the reference mirror. In a similar manner, a distance measurement interferometer (not shown) for detecting the Y-direction position of the wafer stage accurately measures the Y-coordinate of the mirror MY fixed on the wafer stage 2 at a high resolution with reference to the reference mirror.

The alignment optical system 4 irradiates an object (wafer W) with alignment light (this light has a wavelength that does not expose the photosensitive material applied to the wafer W) and detects the image of the object in accordance with the reflected light from the object. An alignment optical system control section 8 detects the position of the object with respect to the reference position of the alignment optical system 4.

A main control system 9 processes data from the electron optical system control section 5, alignment optical system control section 8, stage position detection section 7, and wafer stage control section 6, and issues instructions to these sections. A memory 10 stores information necessary for the main control system 9.

In this exposure apparatus, basically, a pattern is formed at a plurality of shot positions on a substrate by exposure in a step-and-repeat operation. When a charged particle beam is to be deflected to draw patterns on the substrate placed on the stage by exposure, the deflector for deflecting the charged particle beam is controlled or the position of the stage is controlled to correct the reference position of the charged particle beam on the stage.

Before a detailed description of an exposure operation, the coordinate system in the exposure apparatus of this embodiment will be described. The position of the X stage 23 is determined by the stage position detection section 7. As the design, a position where the electron beam from the electron optical system 1 becomes incident on the stage side without being deflected by the deflector 13 is set as the electron beam reference position. When the center of the electrostatic chuck 25 is located at the reference position, the stage position detection section 7 detects (x, y)=(0,0) on the stage coordinate system (x, y).

Examples of operation of the electron beam exposure apparatus according to the first embodiment shown in FIGS. 1A to 3 will be described below.

First Operation Example

Figure 4:
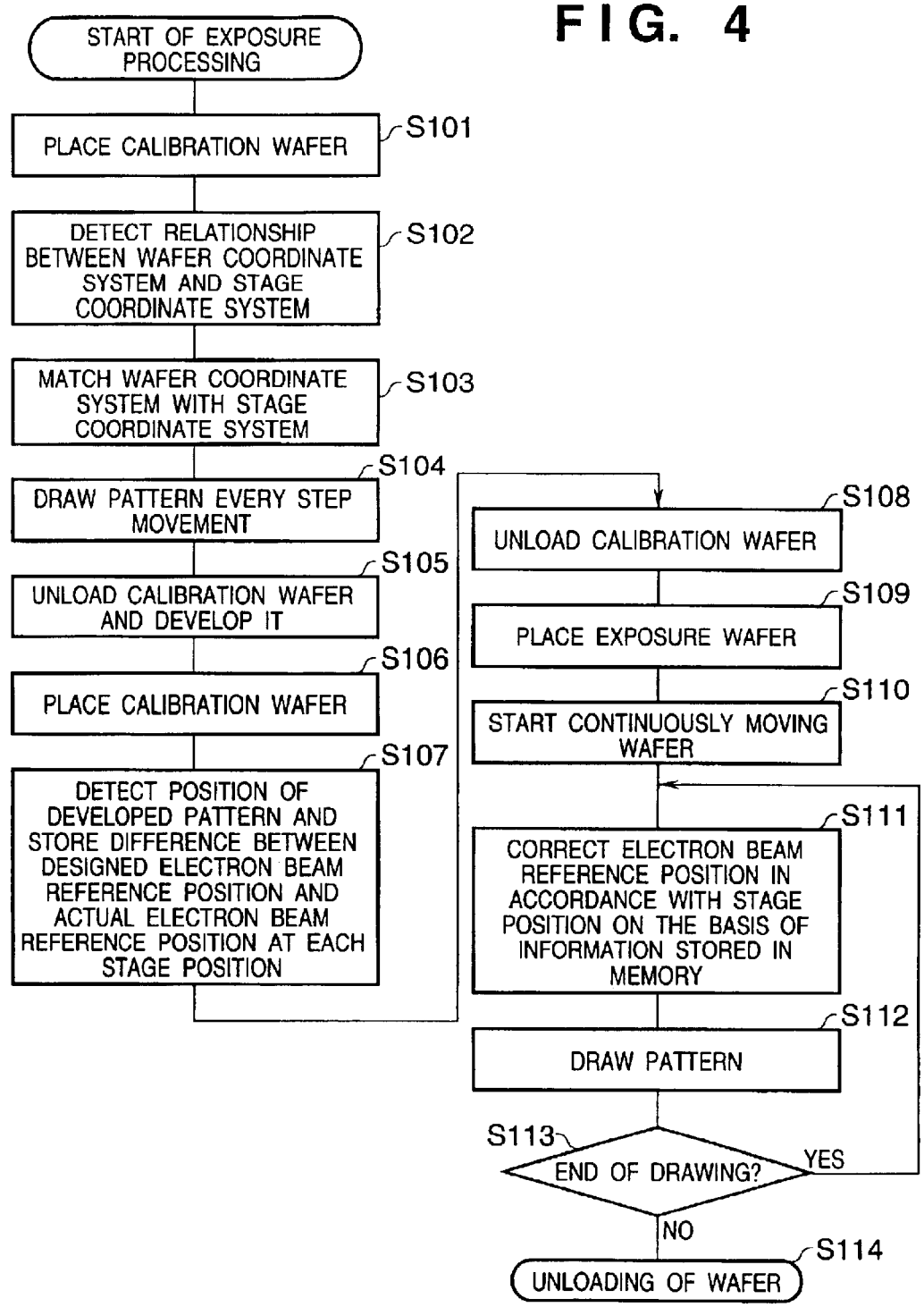
FIG. 4 is a flow chart showing the flow of exposure processing of the first operation example of the electron beam exposure apparatus according to the first embodiment of the present invention.

FIG. 4 is a flow chart showing the first operation example of the electron beam exposure apparatus according to the first embodiment of the present invention. The first operation example will be described below with reference to FIG. 4.

(Step S101)

A calibration wafer (calibration substrate) is placed on the electrostatic chuck 25 of the wafer stage 2.

Figure 5:
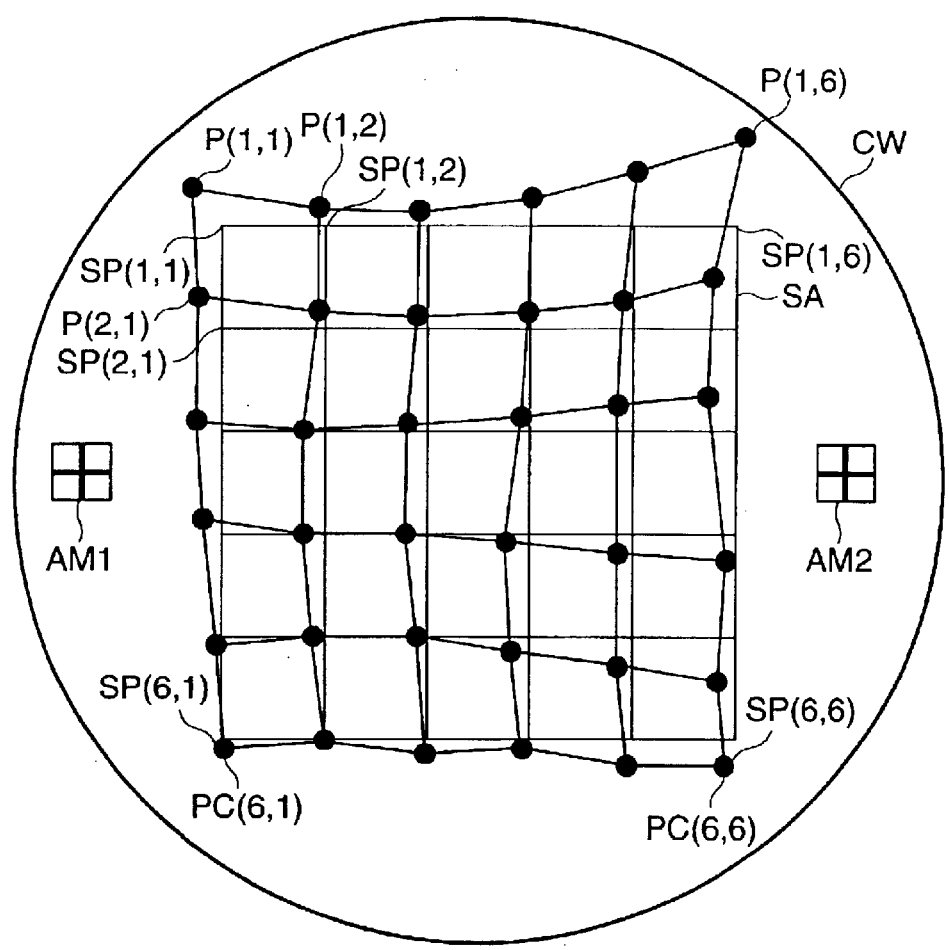
FIG. 5 is a view for explaining a calibration wafer applied to the first operation example.

The surface of the calibration wafer is coated with a resist. A calibration wafer CW has wafer alignment marks AM1 and AM2, as shown in FIG. 5. The wafer coordinate system on the wafer is defined by the wafer alignment marks AM1 and AM2. The calibration wafer CW is placed on the electrostatic chuck 25 such that the center of the calibration wafer CW, which is defined by the wafer alignment marks AM1 and AM2, is located at the center of the electrostatic chuck 25.

(Step S102)

The wafer alignment marks AM1 and AM2 on the calibration wafer CW are sequentially set under the alignment optical system 4. The position of the X stage 23 at that time is detected by the distance measurement interferometer 3. Also, the positions of the wafer alignment marks AM1 and AM2 are detected by the alignment optical system 4. As a consequence, the positions of the wafer alignment marks AM1 and AM2 on the stage coordinate system when the X stage 23 is located at (x,y)=(0,0) are calculated. The relationship between the wafer coordinate system defined by the wafer alignment marks AM1 and AM2 and the stage coordinate system defined by the stage position detection section 7 can be detected.

(Step S103)

On the basis of the detected relationship between the wafer coordinate system and the stage coordinate system, the stage position detection section 7 sets the stage coordinate system again such that the coordinate origins and coordinate axes of the two coordinate systems coincide with each other. As a result, the center of the calibration wafer CW accurately matches that of the electrostatic chuck 25.

(Step S104)

The wafer stage 2 moves the calibration wafer CW stepwise every shot. At the same time, a pattern is drawn at the electron beam reference position on the calibration wafer CW using the electron beam EB from the electron optical system 1 for every step movement.

The wafer stage control section 6 moves the calibration wafer CW stepwise while the stage position detection section 7 detects the position of the X stage 23 such that the loci of the designed electron beam reference position coincide with a reference alignment grating SA on the calibration wafer CW, as shown in FIG. 5. When the designed electron beam reference position is located at a lattice point SP(i,j) of the alignment grating SA, a pattern (P(i,j)) is drawn. As shown in FIG. 5, as the wafer stage 2 is driven, the actual electron beam reference position varies. Hence, the lattice point SP(i,j) as the designed electron beam reference position is different from the actual electron beam reference position.

(Step S105)

The calibration wafer CW is unloaded from the electron beam exposure apparatus and developed.

(Step S106)

The developed calibration wafer CW is placed on the electrostatic chuck 25 again, as in step S101.

(Step S107)

The developed pattern (P(i,j)) and the wafer alignment marks AM1 and AM2 are sequentially located under the alignment optical system 4. The stage position at that time is detected by the distance measurement interferometer 3. Also, the positions of the pattern (P(i,j)) and wafer alignment marks AM1 and AM2 are detected by the alignment optical system 4. The difference between the coordinate position of the pattern (P(i,j)) and that of the lattice point SP(i,j) on the wafer coordinate system defined by the wafer alignment marks AM1 and AM2 is calculated. The calculation result is stored in the memory 10. That is, the difference between the designed electron beam reference position and the actual electron beam reference position at each stage position (the correction amount of the electron beam reference position at each stage position) is stored in the memory 10.

(Step S108)

The calibration wafer CW is unloaded from the electron beam exposure apparatus.

(Step S109)

An exposure wafer is placed on the electrostatic chuck 25 of the wafer stage 2.

(Step S110)

The wafer stage 2 starts continuously moving the wafer.

(Step S111)

The correction amount of the electron beam reference position at the current stage position is obtained on the basis of the current stage position detected by the stage position detection section 7 and the correction amount of the electron beam reference position at each stage position, which is stored in the memory 10. The electron optical system control section 5 is instructed to cause the deflector 13 to correct the electron beam reference position by the correction amount. Alternatively, the wafer stage control section 6 is instructed to correct the position of the X stage 23 by the correction amount such that the electron beam is located at the designed reference position.

The memory 10 does not store electron beam reference position correction amounts corresponding to all stage positions. The correction amount of the electron beam reference position at the current stage position is obtained by interpolating the correction amounts of electron beam reference positions at a plurality of stage positions close to the current stage position in the stored electron beam reference position correction amounts for every stage position.

(Step S112)

The electron optical system control section is instructed to deflect the electron beam EB from the electron optical system 1 on the basis of drawing control data stored in the main control system 9 in advance and control irradiation to draw a pattern on the wafer W.

(Step S113)

When the pattern is drawn in all drawing regions on the wafer W, the flow advances to the next step. Otherwise, the flow returns to step S111.

(Step S114)

The wafer W is unloaded from the electron beam exposure apparatus. To process a plurality of wafers W, processing in steps S109 to S113 is repeatedly executed.

In the first embodiment, the calibration wafer CW is unloaded from the electron beam exposure apparatus and developed. Instead, the position of the pattern (P(i,j)) may be detected by the alignment optical system 4 without unloading the wafer from the electron beam exposure apparatus by using, in place of the resist, a film material such as a photochromic material whose optical characteristics (refractive index and absorption coefficient) change when it is irradiated with an electron beam. In the first embodiment, the alignment optical system 4 in the electron beam exposure apparatus detects the position of the pattern (P(i,j)). However, the position of the pattern (P(i,j)) may be detected using a position detection apparatus separated from the electron beam exposure apparatus and transferred to the memory 10.

As described above, according to this exposure apparatus, when a pattern is to be drawn on a substrate placed on the stage by deflecting a charged particle beam, the deflector for deflecting the charged particle beam or the position of the stage is controlled during movement of the stage, thereby correcting the reference position of the charged particle beam with respect to the stage. Since the change in position of the charged particle beam during movement of the stage can be corrected, the accuracy of exposure using the charged particle beam does not degrade.

In the above example, when a pattern is drawn in each of the plurality of shot regions on the substrate by a step-and-repeat operation, the reference position is continuously corrected in accordance with the stage position in each shot region. However, the reference position may be corrected in accordance with the position of each shot region where a pattern is to be drawn.

As described above, according to the first operation example, since the change in position of the charged particle beam during movement of the stage can be corrected, the accuracy of exposure using the charged particle beam does not degrade. When a device is manufactured using this drawing method or apparatus, a device more accurate than a conventional device can be manufactured.

Second Operation Example

Figure 6:
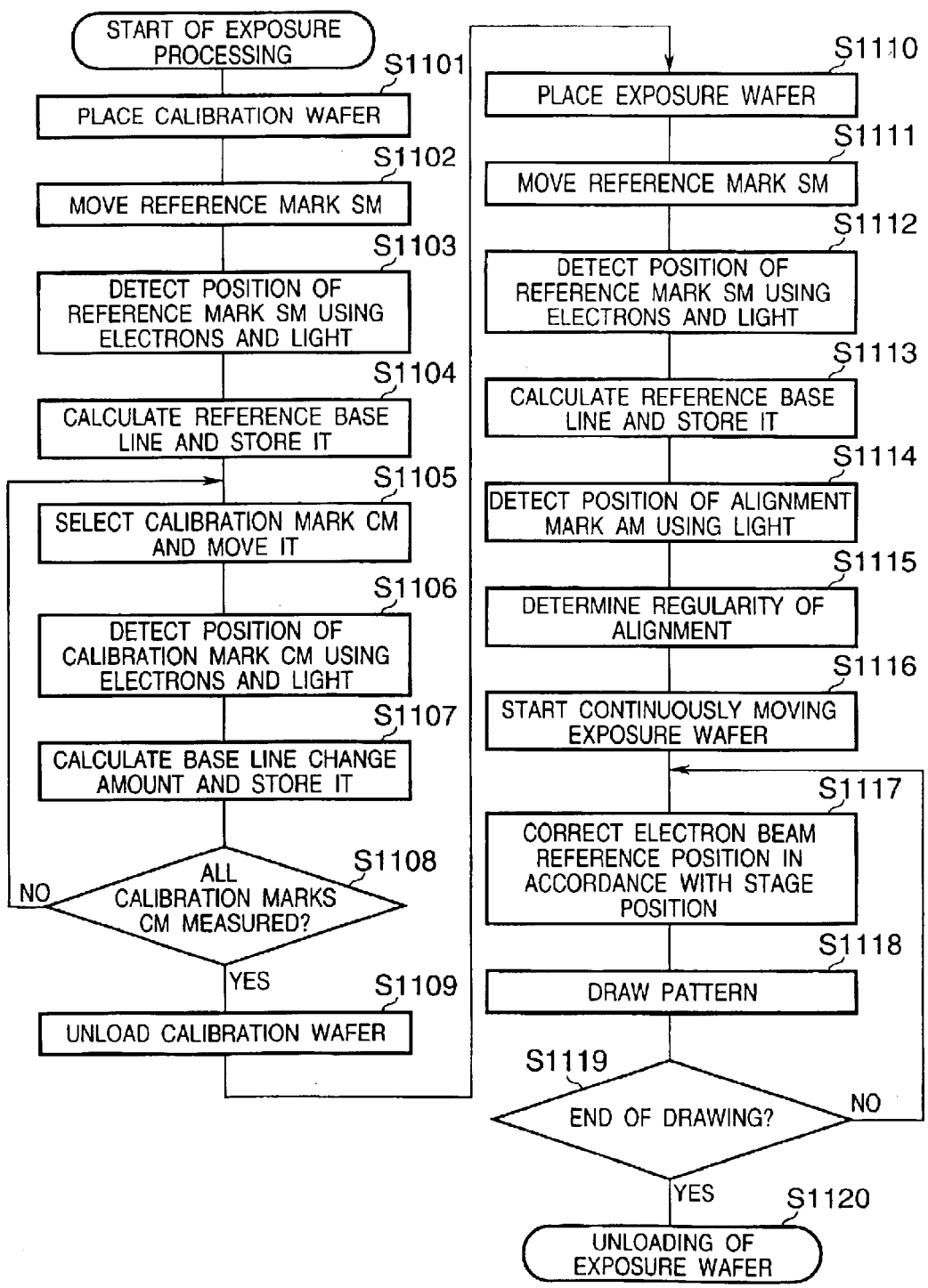
FIG. 6 is a flow chart showing the flow of exposure processing of the second operation example of the electron beam exposure apparatus according to the first embodiment of the present invention.

FIG. 6 is a flow chart showing the second operation example of the electron beam exposure apparatus according to the first embodiment of the present invention. The second operation example will be described below with reference to FIG. 6.

(Step S1101)

The calibration wafer CW (calibration substrate) is placed on the electrostatic chuck 25 of the wafer stage 2.

Figure 7:
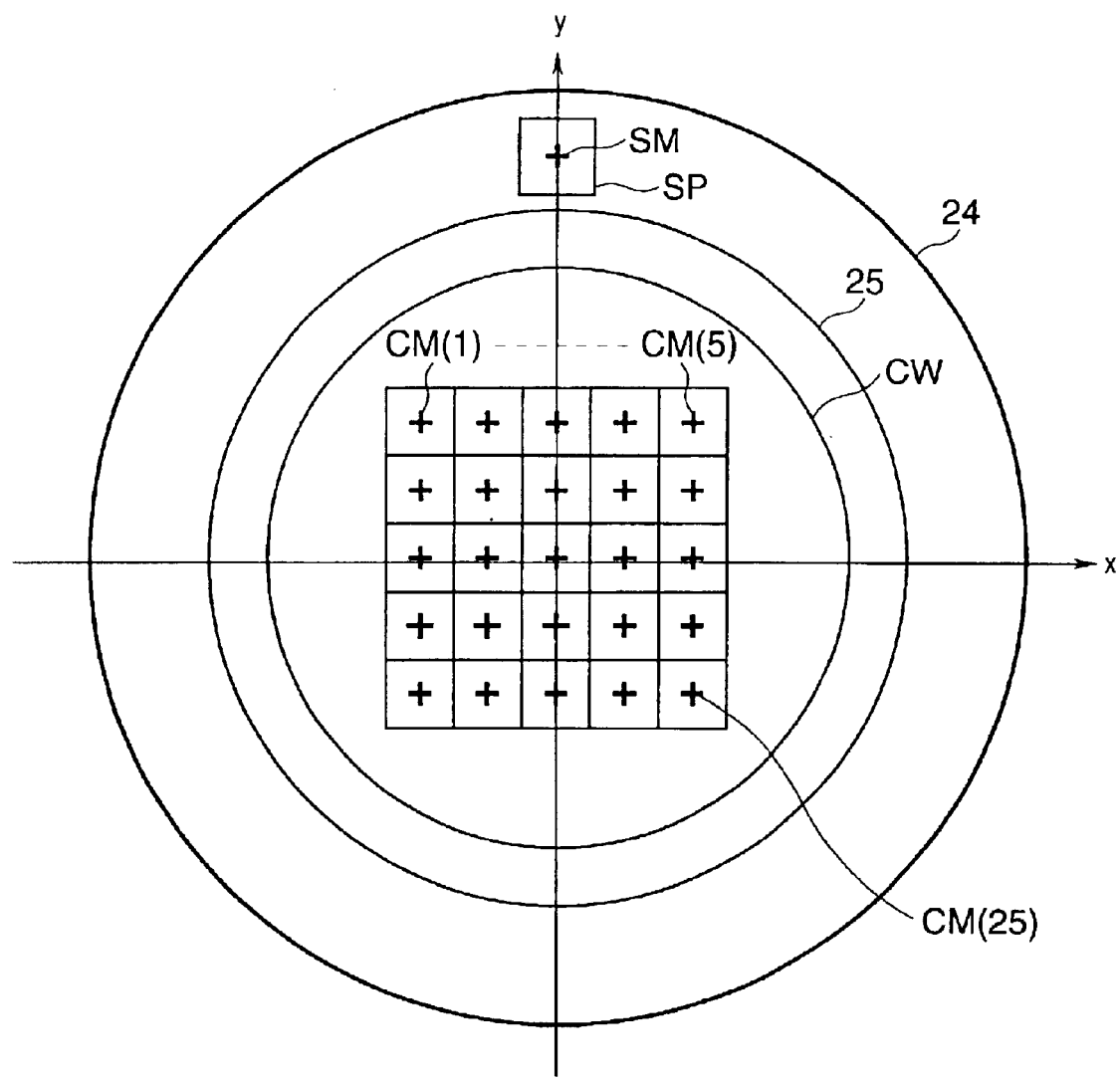
FIG. 7 is a view for explaining a calibration wafer applied to the second operation example.

The calibration wafer CW has a plurality of calibration alignment marks CM, as shown in FIG. 7. As shown in FIG. 7, a reference plate SP having a stage reference mark SM with the same shape as that of the alignment mark AM is fixed on the θ-Z stage 24 of the wafer stage 2. The designed position of the stage reference mark SM in the stage coordinate system is known in advance.

(Step S1102)

On the basis of the designed reference position of the electron optical system 1 and the designed position of the stage reference mark SM, the wafer stage control section 6 controls the wafer stage 2 such that the stage reference mark SM is located at the reference position of the electron optical system 1.

(Step S1103)

The stage reference mark SM is scanned by the electron optical system 1, i.e., the electron beam. The electron detection system 14 detects electrons generated at this time, thereby detecting the position (xs1, ys1) of the stage reference mark SM with respect to the reference position of the electron optical system 1. On the basis of the designed base line, the wafer stage control section 6 controls the wafer stage 2 such that the stage reference mark SM is moved from the reference position of the electron optical system 1 to the reference position of the alignment optical system 4. The alignment optical system 4 detects the position (xs2, ys2) of the stage reference mark SM with respect to the reference position of the alignment optical system 4.

(Step S1104)

On the basis of the detection result in step S1103, a change amount (δxs, δys) of the actual base line with respect to the designed base line is obtained as follows.

$$\delta xs = xs1 - xs2$$

$$\delta ys = ys1 - ys2$$

The reference base line (xs,ys) is defined as follows and stored in the memory 10.

$$(xs,ys) = (xsd + \delta xs, ysd + \delta ys)$$

(Step S1105)

The wafer stage control section 6 controls the wafer stage 2 such that one alignment mark CM(i) on the calibration wafer CW is located at the reference position of the electron optical system 1. The position (SX(i),SY(i)) of the wafer stage at that time is detected.

(Step S1106)

The electron optical system 1 detects the position (x1,y1) of the alignment mark CM(i) with respect to the reference position of the electron optical system 1. On the basis of the reference base line (xs,ys), the wafer stage control section 6 controls the wafer stage 2 such that the alignment mark CM(i) is moved from the reference position of the electron optical system 1 to the reference position of the alignment optical system 4. The alignment optical system 4 detects the position (x2,y2) of the alignment mark CM(i) with respect to the reference position of the alignment optical system 4.

(Step S1107)

On the basis of the detection result in step S1106, the change amount (δx(i), δy(i)) of the base line in use of the alignment mark CM(i) with respect to the reference base line is obtained as follows.

$$\delta x(i) = x1 - x2$$

$$\delta y(i) = y1 - y2$$

The change amount (δx(i), δy(i)) of the base line and the position (SX(i),SY(i)) of the wafer stage 2 are stored in the memory 10. The change amount (δx(i), δy(i)) of the base line is probably due to the change in reference position of the electron beam when the wafer stage 2 moves. The reason for this is as follows. Even when the electromagnetic field varies during movement of the wafer stage 2, the alignment optical system 4 is not influenced by the variation because it uses light. Hence, the reference position of the alignment optical system 4 is very stable even when the wafer stage 2 moves.

(Step S1108)

When processing in steps S1105 to S1107 is executed for all alignment marks CM(i), i.e., alignment marks CM(1) to CM(25), the flow advances to the next step. Otherwise, the value i is changed, and the flow returns to step S1105.

(Step S1109)

The calibration wafer CW is unloaded from the electron beam exposure apparatus.

(Step S1110)

Figure 8:
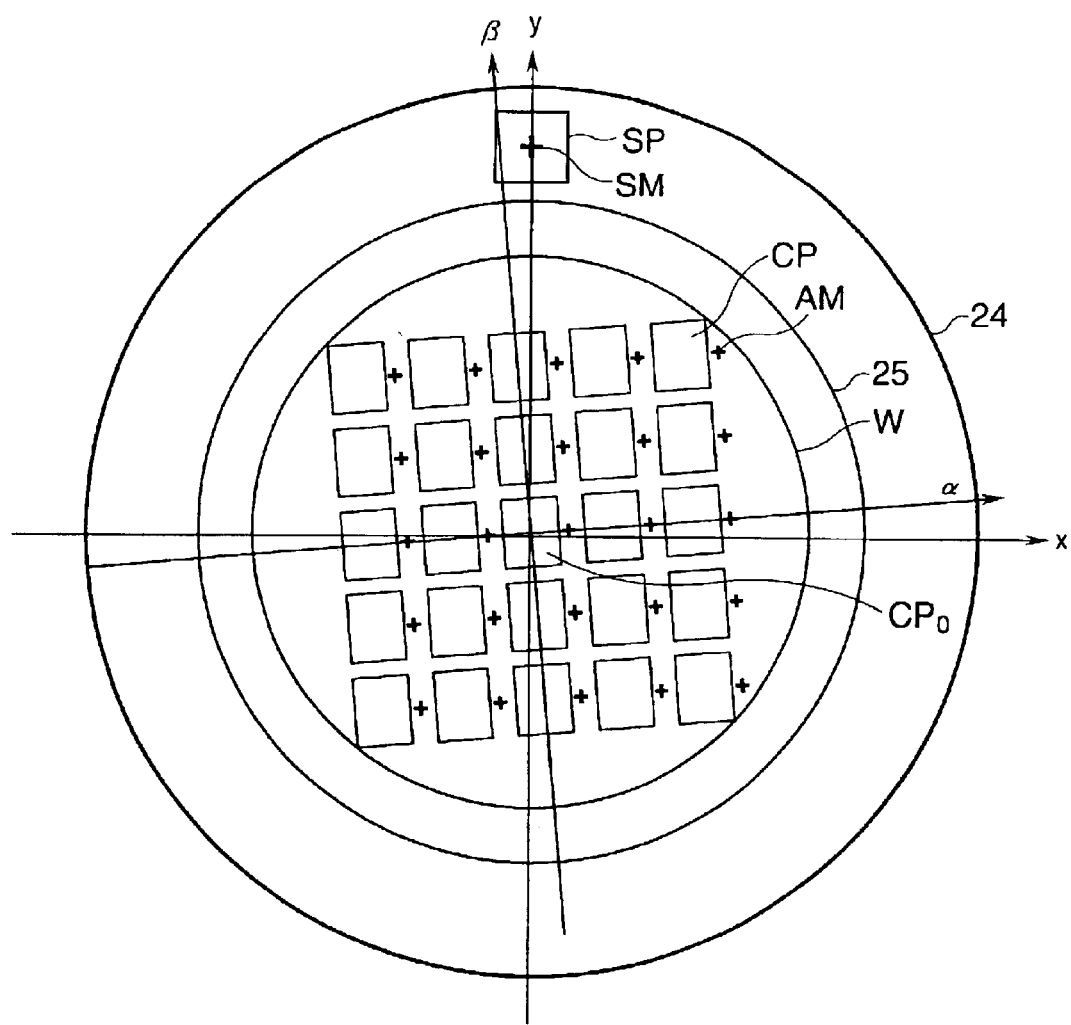
FIG. 8 is a view for explaining an exposure wafer applied to the second operation example.

The exposure wafer W is placed on the electrostatic chuck 25 of the wafer stage 2. On the placed wafer W, a plurality of rectangular pattern regions CP are formed in a matrix along an alignment coordinate system αβ, as shown in FIG. 8. Each of the pattern regions CP is overlaid on the pattern to be drawn by the electron beam. Each pattern region CP has a mark AM for alignment in the X and Y directions. The origin of the alignment coordinate system αβ is set to match the central point of a pattern region CP0 near the center of the wafer W. The designed coordinate values (or the stepping pitches in the X and Y directions) of each pattern region CP in the alignment coordinate system αβ are stored in the memory 10 shown in FIG. 1A in advance.

(Step S1111)

On the basis of the designed reference position of the electron optical system 1 and the designed position of the stage reference mark SM, the wafer stage control section 6 controls the wafer stage 2 such that the stage reference mark SM is located at the reference position of the electron optical system 1.

(Step S1112)

The electron optical system 1 detects the position (xs1, ys1) of the stage reference mark SM with respect to the reference position of the electron optical system 1. On the basis of the reference base line stored in step S1104, the wafer stage control section 6 controls the wafer stage 2 such that the stage reference mark SM is moved from the reference position of the electron optical system 1 to the reference position of the alignment optical system 4. The alignment optical system 4 detects the position (xs2,ys2) of the stage reference mark SM with respect to the reference position of the alignment optical system 4.

(Step S1113)

On the basis of the detection result in step S1112, the change amount (δxs, δys) of the actual base line with respect to the reference base line is obtained as follows.

$$\delta xs = xs1 - xs2$$

$$\delta ys = ys1 - ys2$$

The reference base line (xs,ys) is set again as follows and stored in the memory 10.

$$(xs,ys) = (xs + \delta xs, ys + \delta ys)$$

(Step S1114)

The alignment marks on the wafer W are sequentially selected. On the basis of the designed coordinate position (xi, yi), the alignment mark AM of the selected pattern region CP is moved to the reference position of the alignment optical system 4. The electron optical system control section 5 detects the positional shift of the alignment mark AM from the reference position and calculates the actual measurement values (XXi,YYi) of the position of the alignment mark AM.

(Step S1115)

The regularity of the alignment of the pattern regions CP on the wafer W is determined on the basis of the actual measurement values (XXi,YYi) of the positions of the alignment marks AM.

(Step S1116)

The wafer stage 2 starts continuously moving the wafer.

(Step S1117)

The correction amount of the electron beam reference position at the current stage position is obtained on the basis of the current stage position detected by the stage position detection section 7 and the change amount of the base line (the change amount of the electron beam reference position) at each stage position, which is stored in the memory 10 in step S1107. The electron optical system control section 5 is instructed to cause the deflector 13 to correct the electron beam reference position by the correction amount. Alternatively, the wafer stage control section 6 is instructed to correct the position of the X stage 23 by the correction amount.

Figure 9:
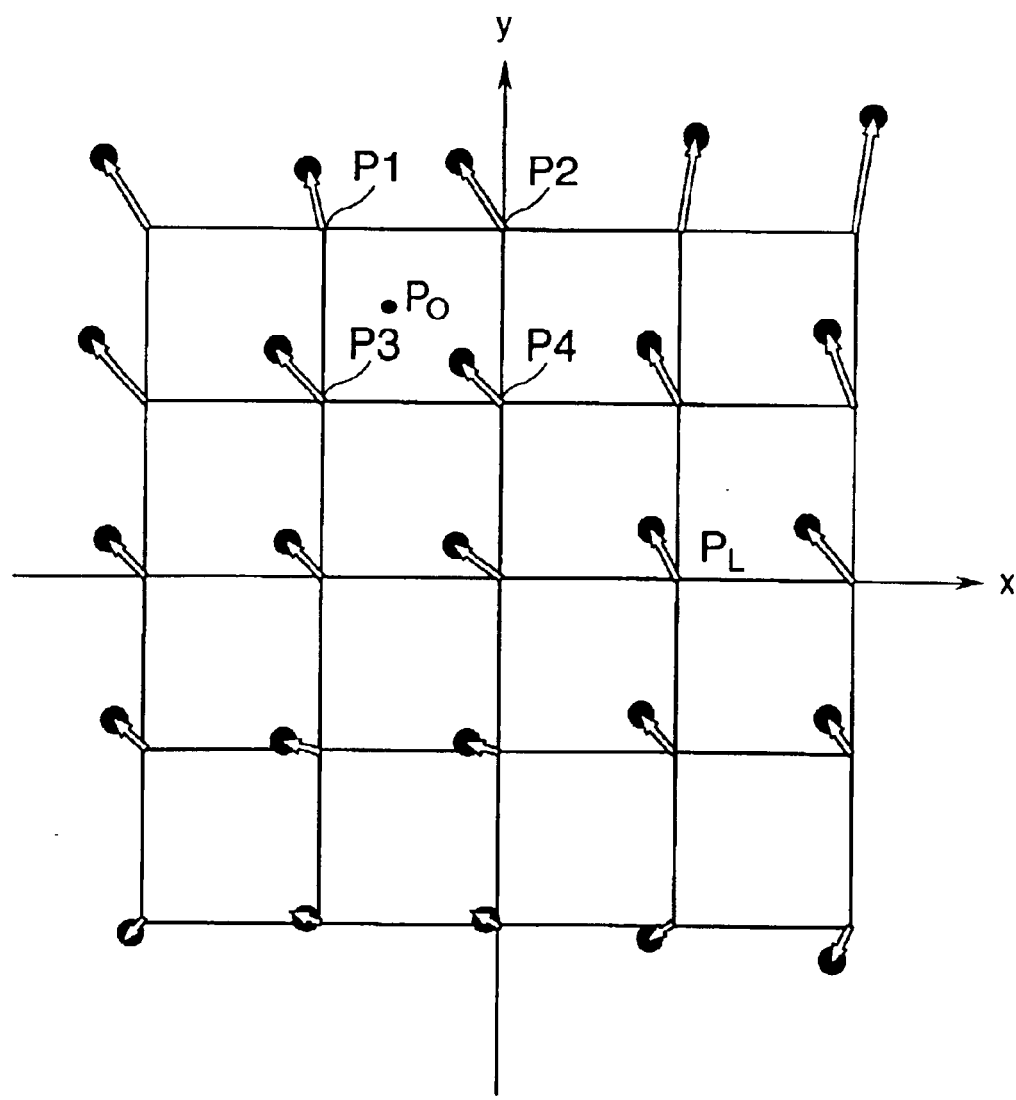
FIG. 9 is a view for explaining the change amounts of a base line according to the position of the wafer stage.

The memory 10 does not store base line change amounts (electron beam reference position correction amounts) corresponding to all stage positions. FIG. 9 shows the stored change amounts (indicated by arrows as vectors in FIG. 9) of the base line for every position of the wafer stage 2. The base line change amounts stored in the memory 10 are discrete. The correction amount of the electron beam reference position at the current stage position is obtained by interpolating the base line change amounts (the correction amounts of electron beam reference positions) at a plurality of stage positions (p1 to p4) close to the current stage position (p0) in the stored base line change amounts (electron beam reference position correction amounts) for every stage position.

(Step S1118)

The actual position (Xi,Yi) with respect to the designed position (xi,yi) in each pattern region CP is calculated on the basis of the reference base line and the determined regularity of alignment. A pattern corresponding to the design value (xi,yi) of the pattern region CP is drawn by actuating at least one of the deflector 13 and wafer stage 2 such that the electron beam EB is positioned at the calculated actual position (Xi,Yi).

(Step S1119)

When the pattern is written in all drawing regions on the wafer W, the flow advances to the next step. Otherwise, the flow returns to step S1117.

(Step S1120)

The wafer W is unloaded from the electron beam exposure apparatus. To process a plurality of wafers W, processing in steps S1110 to S1120 is repeatedly executed.

As described above, according to this exposure apparatus, when a pattern is to be drawn on a substrate placed on the stage by exposure by deflecting a charged particle beam, the deflector for deflecting the charged particle beam or the position of the stage is controlled during movement of the stage, thereby correcting the reference position of the charged particle beam with respect to the stage. Since the change in position of the charged particle beam during movement of the stage can be corrected, the accuracy of exposure using the charged particle beam does not degrade.

In the above example, when a pattern is drawn in each of the plurality of shot regions on the substrate by exposure in a step-and-repeat operation, the reference position is continuously corrected in accordance with the stage position in each shot region. However, the reference position may be corrected in accordance with the position of each shot region where a pattern is to be drawn.

As described above, according to the second operation example, since the change in position of the charged particle beam during movement of the stage can be easily detected and corrected, the accuracy of drawing using the charged particle beam does not degrade. When a device is manufactured using this drawing method or apparatus, a device more accurate than a conventional device can be manufactured.

[Second Embodiment]

In this embodiment, an electron beam exposure apparatus using an electron beam will be described as an example of a charged particle beam exposure apparatus. The present invention can also be applied to an exposure apparatus using, e.g., an ion beam as a charged particle beam.

FIGS. 10A and 10B are views showing the arrangement of the electron beam exposure apparatus according to the second embodiment of the present invention.

Referring to FIGS. 10A and 10B, a vacuum chamber 100 is vacuum-evacuated by a vacuum pump (not shown). The vacuum chamber 100 incorporates an electron optical system 1, wafer stage 2, distance measurement interferometer 3, alignment optical system 4, and the like.

The electron optical system 1 has an electron gun 11 for emitting an electron beam, an electron lens system 12 for focusing an electron beam EB from the electron gun 11, a deflector 13 for deflecting the electron beam EB, an electron detection system 14 for detecting electrons generated when a wafer W is irradiated with the electron beam EB, a dynamic stigmatic coil 15 for adjusting the astigmatism of the electron optical system 1, and a dynamic focus coil 16 for adjusting the astigmatism of the electron optical system. The constituents of the electron optical system are controlled by an electron optical system control section 5. The position where the electron beam from the electron optical system 1 is incident on the stage side without being deflected by deflector 13 is used as the electron beam reference position. To expose the wafer with the electron beam EB, the electron optical system control section 5 causes the electron beam EB to scan via the deflector 13 with reference to the reference position and controls irradiation with the electron beam EB in accordance with the pattern to be drawn. To detect the position of the wafer W using the electron beam EB, the electron optical system control section 5 causes the electron beam EB to scan on the wafer W via the deflector 13 and detects electrons from the wafer W using the electron detection system 14, thereby detecting the electron image on the wafer W.

The wafer stage 2 will be described next. Reference numeral 21 denotes a stage base plate having a reference surface; 22, a Y stage; and 23, an X stage. A θ-Z stage 24 is mounted on the X stage 23. An electrostatic chuck 25 for chucking and fixing the wafer W and mirrors MX and MY (MY is not shown) for the distance measurement interferometer 3 are mounted on the θ-Z stage 24. Reference numeral 26 denotes a fixed guide in the horizontal direction (Y-axis direction) of the Y stage 22. Each of static pressure pneumatic bearings 27a, 27b, 27c, and 27d has a porous pad (ceramic pad) for supplying a gas and a labyrinth partition for preventing outflow of the gas to cope with the vacuum, as proposed in Japanese Patent Laid-Open No. 2-212624. The static pressure pneumatic bearing 27a (FIG. 10B taken along a line A–A') guides the X stage 23 in the horizontal direction (Y-axis direction). The static pressure pneumatic bearing 27b guides the X stage 23 in the vertical direction (Z-axis direction). The static pressure pneumatic bearing 27c guides the Y stage 22 in the horizontal direction. The static pressure pneumatic bearing 27d guides the Y stage 22 in the vertical direction.

FIG. 2 is a view showing the lower surfaces of the Y stage 22 and X stage 23. Referring to FIG. 2, reference symbols MG denote preloading magnet units. As proposed in Japanese Patent Laid-Open No. 63-232912, when the moving bodies 22 and 23 are floated from the reference surface of the surface plate by supplying a pressurizing fluid to the static pressure bearings by a preloading mechanism (mechanism for chucking the moving bodies 22 and 23) having, as a magnetic force unit, a permanent magnet and yokes (magnetic material) provided on both sides of the magnet, the preloading magnet units MG prevent the moving bodies 22 and 23 from tilting due to the variation in the characteristics of the bearings and always maintain a predetermined posture with respect to the reference surface of the stage base plate. Except for a guide plate 22a in the horizontal direction of the X stage 23, the surfaces of the Y stage 22 and X stage 23 are covered with magnetic shielding material (e.g., Permalloy) to reduce the influence of the electron beam. In this embodiment, as the preloading mechanism for providing a chucking force between the stages 22 and 23 and the reference surface of the stage base plate 21 to apply preloading, a magnetic preloading mechanism is employed. However, the present invention is not limited to this. A vacuum preloading mechanis for applying preloading by vacuum chucking or an electrostatic preloading mechanism for applying preloading by an electrostatic force may be employed.

FIG. 3 is a plan view showing the upper surfaces of the Y stage 22 and X stage 23. Referring to FIG. 3, the X stage 23 is driven by an arm XA extending/contracting in the X direction. Referring back to FIGS. 10A, the distal end of the arm XA is coupled with the X stage 23 via a Y guide rail YG fixed to the X stage 23 so as not to impede the X stage 23 from moving in the Y direction. The arm XA is driven by an X actuator 28 fixed to the vacuum chamber 100 to extend/contract in the X direction. The Y stage 22 is coupled to an arm YA which is extended/contracted by a Y actuator (not shown), and driven by the arm YA. The X actuator 28 and Y actuator are controlled by a wafer stage control section 6.

When a gas is supplied to the static pressure pneumatic bearings 27c and 27d, the Y stage 22 is floated from the stage base plate 21 and moved by the Y actuator in the Y direction along the fixed guide 26 provided on one side. When a gas is supplied to the static pressure pneumatic bearings 27a and 27b, the X stage 23 is floated from the stage base plate 21, like the Y stage 22, and moved by the X actuator 28 in the X direction using the side surface 22a of the Y stage 22 as a guide in the horizontal direction. At this time, the X stage 23 and Y stage 22 are adjusted by the plurality of preloading magnet units MG to always have predetermined postures.

The distance measurement interferometer 3 splits a laser beam emitted from an internal laser source into a distance measurement beam and a reference beam. The mirror MX on the wafer stage 2 is irradiated with the distance measurement beam. The distance measurement beam is reflected by the mirror MX and returns into the distance measurement interferometer 3. The reference beam is reflected by an internal reference mirror. The intensity signal of interference light of the two returned beams is detected. The emitted distance measurement beam and reference beam have frequencies different from each other by a small amount $\Delta f$ when they are emitted. Hence, a signal whose frequency changes from $\Delta f$ in accordance with the moving speed of the mirror MX in the X direction is output. A stage position detection section 7 processes this intensity signal. With this processing, the change amount of the optical path length of the distance measurement beam with reference to the optical path length of the reference beam, i.e., the X-coordinate of the mirror MX fixed on the wafer stage is accurately measured at a high resolution with reference to the reference mirror. In a similar manner, a distance measurement interferometer (not shown) for detecting the Y-direction position of the wafer stage accurately measures the Y-coordinate of the mirror MY fixed on the wafer stage 2 at a high resolution with reference to the reference mirror.

The alignment optical system 4 irradiates an object (wafer W) with alignment light (this light has a wavelength that does not expose the photosensitive material applied to the wafer W) and detects the image of the object in accordance with the light from the object. An alignment optical system control section 8 detects the position of the object with respect to the reference position of the alignment optical system 4.

A main control system 9 processes data from the electron optical system control section 5, alignment optical system control section 8, stage position detection section 7, and wafer stage control section 6, and issues instructions to these sections. A memory 10 stores information necessary for the main control system 9.

In this exposure apparatus, basically, a pattern is formed at a plurality of shot positions on a substrate by exposure in a step-and-repeat operation. When a charged particle beam is to be deflected to draw patterns on the substrate placed on the stage by exposure, the electron optical system 1 is adjusted in accordance with movement of the stage, thereby correcting the image characteristics (e.g., the focus position and astigmatic amount) of the charged particle beam.

Before a detailed description of an exposure operation, the coordinate system in the exposure apparatus of this embodiment will be described. The position of the X stage 23 is determined by the stage position detection section 7. As the design, a position where the electron beam from the electron optical system 1 becomes incident on the stage side without being deflected by the deflector 13 is set as the electron beam reference position. When the center of the electrostatic chuck 25 is located at the reference position, the stage position detection section 7 detects (x, y)=(0,0) on the stage coordinate system (x, y).

The designed reference position of the electron optical system 1 in the stage coordinate system and the designed reference position of the alignment optical system 4 are known in advance. For this reason, the relative positional relationship, i.e., the relative position between the reference position of the alignment optical system 4 and that of the electron optical system 1 is also known in advance. This relative position will be referred to as a base line hereinafter.

Figure 11:
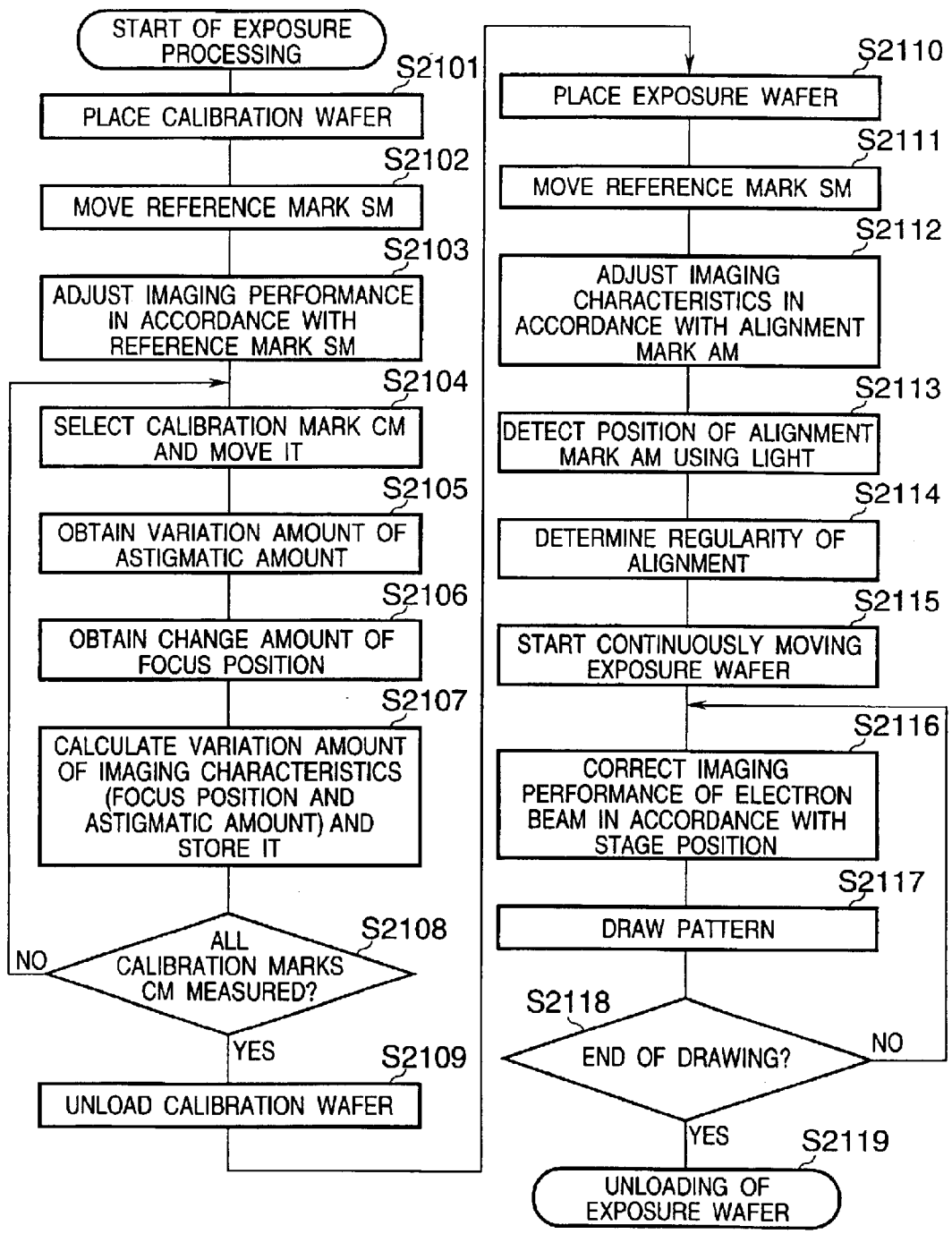
FIG. 11 is a flow chart showing the flow of exposure processing by the electron beam exposure apparatus according to the second embodiment of the present invention.

FIG. 11 is a flow chart showing an operation example of the electron beam exposure apparatus according to the second embodiment. The operation example of the electron beam exposure apparatus according to the second embodiment will be described below with reference to FIG. 11.

(Step S2101)

A calibration wafer CW (calibration substrate) is placed on the electrostatic chuck 25 of the wafer stage 2.

Figure 12B:
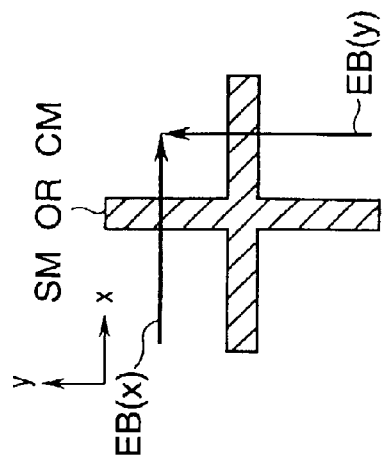
FIGS. 12A and 12B are views for explaining a calibration wafer applied to the electron beam exposure apparatus according to the second embodiment of the present invention.
Figure 12A:
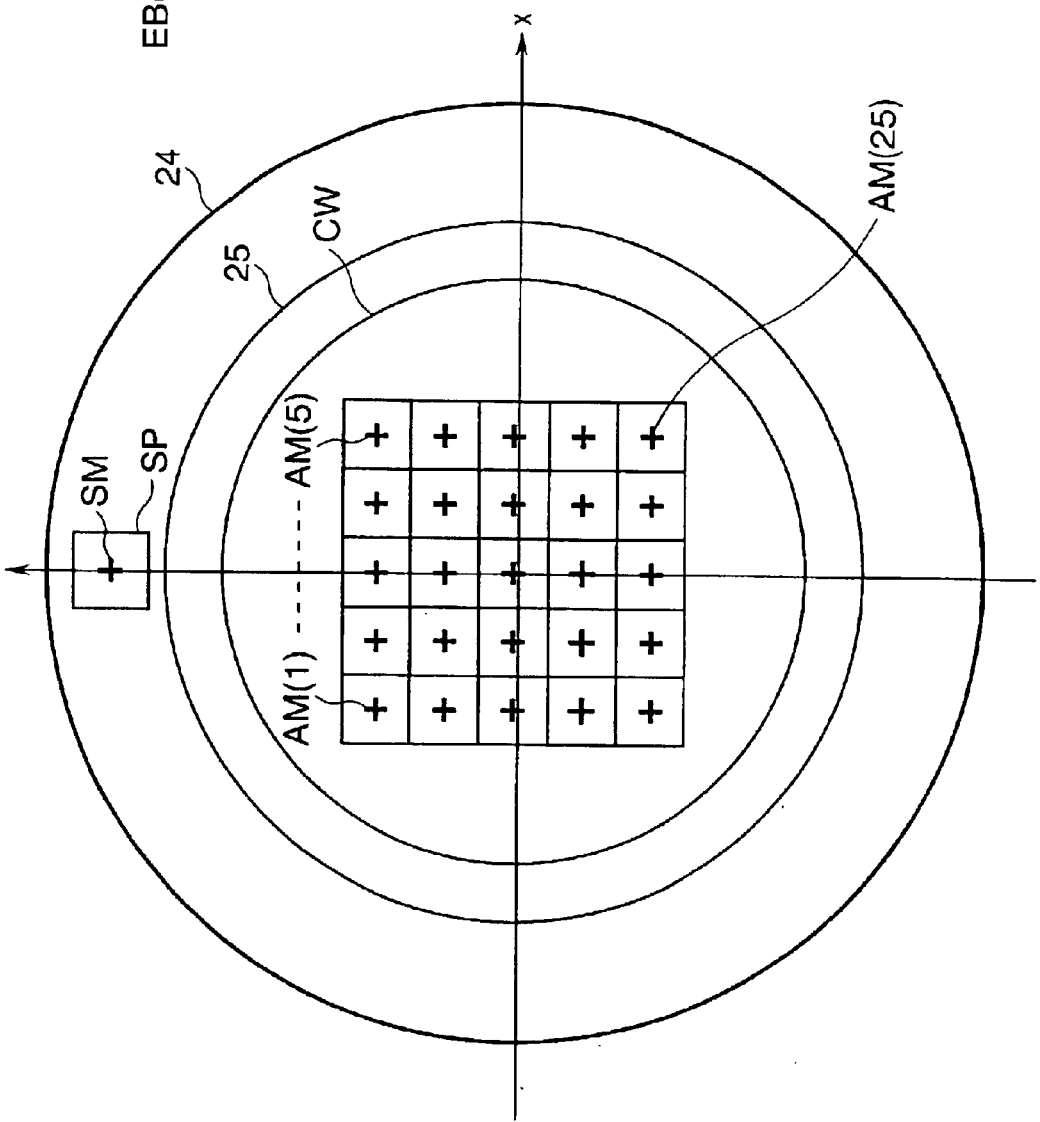

As shown in FIG. 12A, the calibration wafer CW has a plurality of calibration marks CM. As shown in FIG. 12A, a reference plate SP having a stage reference mark SM with the same shape as that of the calibration mark CM is fixed on the θ-Z stage 24 of the wafer stage 2. The position of the stage reference mark SM in the stage coordinate system is known in advance.

(Step S2102)

The wafer stage control section 6 controls the wafer stage such that the stage reference mark SM is located at the reference position of the electron optical system 1.

(Step S2103)

As shown in FIG. 12B, the electron beam EB scans the reference mark SM in the X direction via the deflector 13. Reflected electrons and/or secondary electrons from the reference mark SM are detected by the electron detection system 14 The main control system 9 receives the data of the electron image of the reference mark SM. The blur of the electron beam EB in the X direction is obtained on the basis of the electron image data. In a similar way, the electron beam EB scans the reference mark SM in the Y direction. Reflected electrons and/or secondary electrons from the reference mark SM are detected by the electron detection system 14. The main control system 9 receives the data of the electron image of the reference mark SM. The blur of the electron beam EB in the Y direction is obtained on the basis of the electron image data. Next, setting of the astigmatic amount given by the dynamic stigmatic coil 15 is changed. The electron beam EB scans the reference mark SM again to obtain the blur of the beam in the X and Y directions. The dynamic stigmatic coil 15 is set by repeating this operation such that the beam has substantially the same blur in the X and Y directions. This set value is the reference set value of the dynamic stigmatic coil 15. Further, setting of the focus position defined by the dynamic focus coil 16 is changed. The electron beam EB scans the reference mark SM again in the X or Y direction to obtain the blur of the beam. The dynamic focus coil 16 is set by repeating this operation such that the electron beam EB has a minimum blur. This set value is the reference set value of the dynamic focus coil 16.

With this operation, the electron beam EB is adjusted at the current stage position to have desired imaging characteristics (focus position and astigmatic amount).

(Step S2104)

The wafer stage control section 6 controls the wafer stage 2 such that one calibration mark CM(i) on the calibration wafer CW is located at the reference position of the electron optical system 1. The position (Sx(i),SY(i)) of the wafer stage at that time is detected.

(Step S2105)

The electron beam EB scans the calibration mark CM(i) in the X direction via the deflector 13. Reflected electrons and/or secondary electrons from the calibration mark CM(i) are detected by the electron detection system 14. The main control system 9 receives the data of the electron image of the calibration mark CM(i). The blur of the electron beam EB in the X direction is obtained on the basis of the electron image data. In a similar way, the electron beam EB scans the calibration mark CM(i) in the Y direction. Reflected electrons and/or secondary electrons from the calibration mark CM(i) are detected by the electron detection system 14. The main control system 9 receives the data of the electron image of the calibration mark CM(i). The blur of the electron beam EB in the Y direction is obtained on the basis of the electron image data. Next, setting of the astigmatic amount given by the dynamic stigmatic coil 15 is changed. The electron beam EB scans the calibration mark CM(i) again to obtain the blur of the beam in the X and Y directions. The set value of the dynamic stigmatic coil 15 is determined by repeating this operation such that the beam has substantially the same blur in the X and Y directions. The variation amount of the set value of the dynamic stigmatic coil 15 with respect to the reference set value is obtained. This difference represents information corresponding to the variation in astigmatic amount during movement of the stage.

(Step S2106)

Setting of the focus position defined by the dynamic focus coil 16 is changed. The electron beam EB scans the calibration mark CM(i) again in the X or Y direction to obtain the blur of the electron beam EB. The set value of the dynamic focus coil 16 is determined by repeating this operation such that the electron beam EB has substantially the same blur. The variation amount of the set value of the dynamic focus coil 16 with respect to the reference set value is obtained. This difference represents information corresponding to the change in focus position during movement of the stage.

(Step S2107)

The variation amounts of the set values of the dynamic stigmatic coil 15 and dynamic focus coil 16 with resect to the reference set value and the position (SX(i),SY(i)) of the wafer stage are stored in the memory 10.

(Step S2108)

When processing in steps S2104 to S2107 is executed for all calibration marks CM(i), the flow advances to the next step. Otherwise, the flow returns to step S2104.

(Step S2109)

The calibration wafer CW is unloaded from the electron beam exposure apparatus.

(Step S2110)

Figure 13:
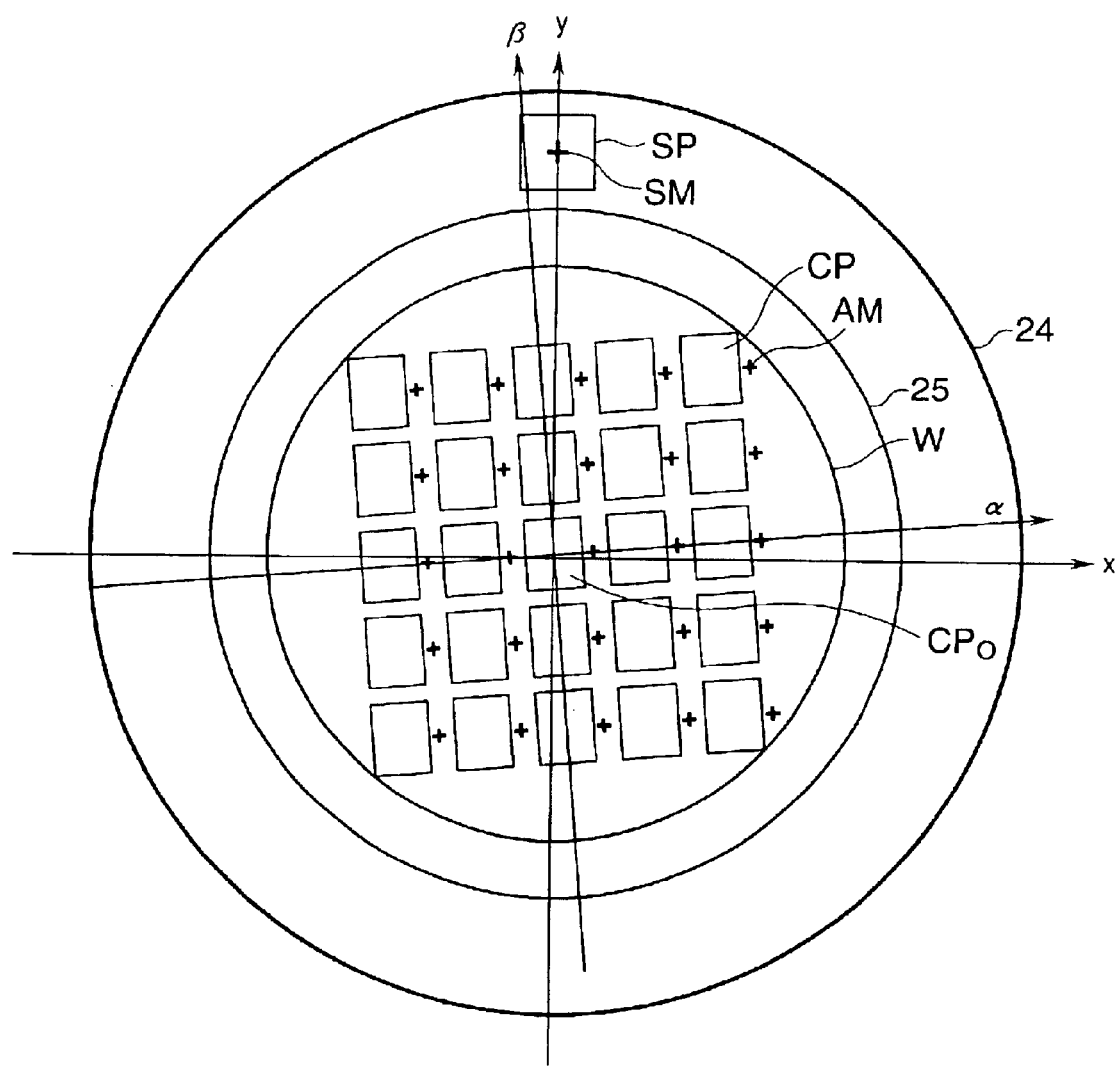
FIG. 13 is a view for explaining an exposure wafer applied to the electron beam exposure apparatus according to the second embodiment of the present invention.

The exposure wafer W is placed on the electrostatic chuck 25 of the wafer stage 2. On the placed wafer W, a plurality of rectangular pattern regions CP are formed in a matrix along an alignment coordinate system αβ, as shown in FIG. 13. Each of the pattern regions CP is overlaid on the pattern to be drawn by the electron beam. Each pattern region CP has a mark AM for alignment in the X and Y directions. The origin of the alignment coordinate system αβ is set to match the central point of a pattern region CP0 near the center of the wafer W. The designed coordinate values (or the stepping pitches in the X and Y directions) of each pattern region CP in the alignment coordinate system αβ are stored in the memory 10 shown in FIG. 10A in advance.

(Step S2111)

The wafer stage control section 6 controls the wafer stage such that the stage reference mark SM is located at the reference position of the electron optical system 1.

(Step S2112)

The electron beam EB is adjusted to have desired imaging characteristics (focus position and astigmatic amount) by the same processing as in step S2103.

(Step S2113)

The alignment marks on the wafer W are sequentially selected. On the basis of the designed coordinate position (xi,yi), the alignment mark AM of the selected pattern region CP is moved to the reference position of the alignment optical system 4. The electron optical system control section 5 detects the positional shift of the alignment mark AM from the reference position and obtains the actual measurement values (XXi,YYi) of the position of the alignment mark AM.

(Step S2114)

The regularity of the alignment of the pattern regions CP on the wafer W is determined on the basis of the actual measurement values (XXi,YYi) of the positions of the alignment marks AM.

(Step S2115)

The wafer stage 2 starts continuously moving the wafer.

(Step S2116)

On the basis of the current stage position from the stage position detection section 7, and the variation amounts of the set values of the dynamic stigmatic coil 15 and dynamic focus coil 16 at each stage position (variation amounts of the imaging characteristics (focus position and astigmatic amount) of the electron beam EB at each stage position), the set values of the dynamic stigmatic coil 15 and dynamic focus coil 16 are changed from the current stage position by corresponding variation amounts to adjust the imaging characteristics of the electron optical system 1, thereby correcting the electron beam EB to have desired imaging characteristics (focus position and astigmatic amount).

Figure 14:
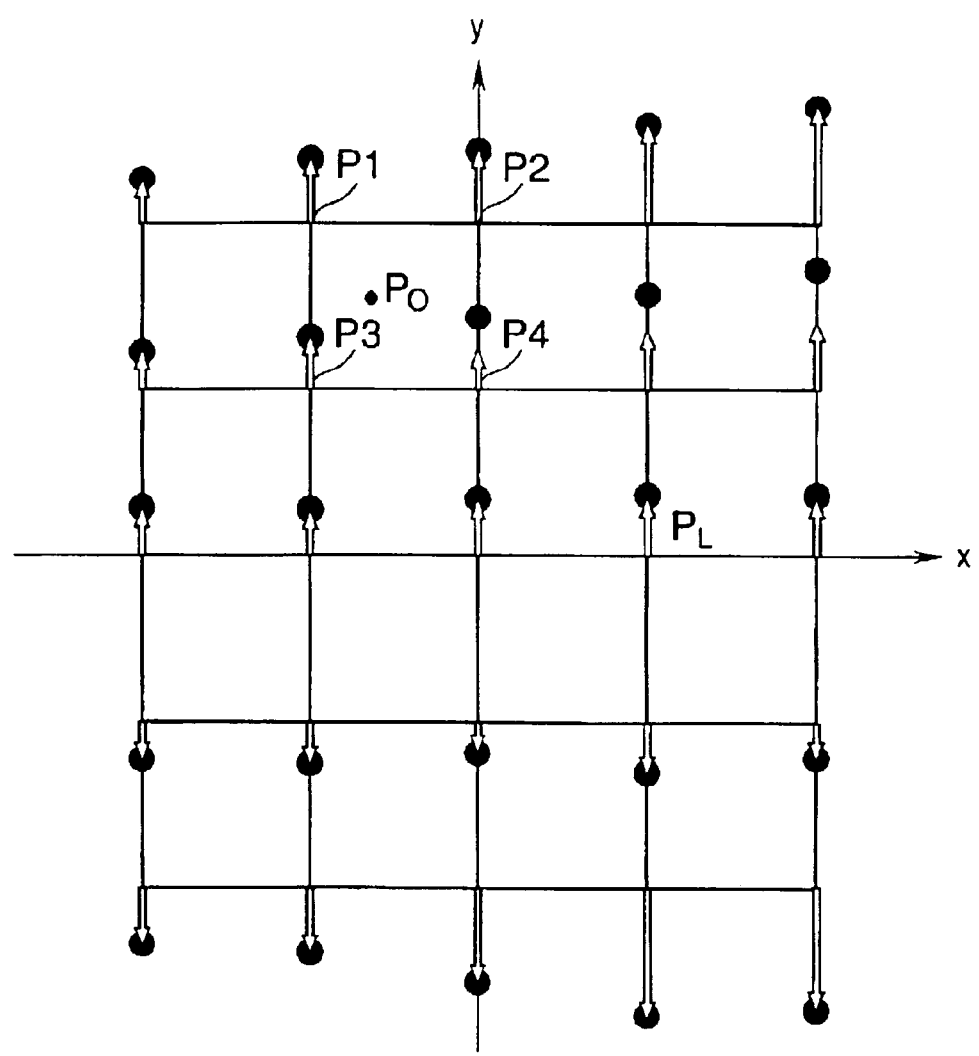
FIG. 14 is a view for explaining the variation amount of the focus position according to the position of the wafer stage.

The memory 10 does not store the variation amounts of the imaging characteristics (focus position and astigmatic amount) corresponding to all stage positions. FIG. 14 shows the stored change amounts of the focus position for every position of the wafer stage 2. (The reference set value is used as a reference. A positive change amount is indicated by an upward arrow, and a negative change amount is indicated by a downward arrow.) The focus position change amounts stored in the memory 10 are discrete. The set value of the focus position at the current stage position is obtained by interpolating the focus positions at a plurality of stage positions (p1 to p4) close to the current stage position (p0) in the stored focus position change amounts (electron beam reference position correction amounts) for every stage position. This also applies to the astigmatic amount.

(Step S2117)

The actual position (Xi,Yi) with respect to the designed position (xi,yi) in each pattern region CP is calculated on the basis of the reference base line and the determined regularity of alignment. A pattern corresponding to the design value (xi,yi) of the pattern region CP is drawn by actuating at least one of the deflector 13 and wafer stage 2 such that the electron beam EB is positioned at the actual position (Xi,Yi).

(Step S2118)

When the pattern is drawn in all shot regions (drawing regions) on the wafer W, the flow advances to the next step. Otherwise, the flow returns to step S2116.

(Step S2119)

The wafer W is unloaded from the electron beam exposure apparatus. To process a plurality of wafers W, processing in steps S2110 to S2119 is repeatedly executed.

As described above, according to the second embodiment of the present invention, since the variation in imaging characteristics (e.g., the focus position and astigmatic amount) of the charged particle beam due to movement of the stage can be corrected, the accuracy of drawing using the charged particle beam does not degrade. When a device is manufactured using this drawing method or apparatus, a device more accurate than a conventional device can be manufactured.

[Device Manufacturing Method]

Figure 15:
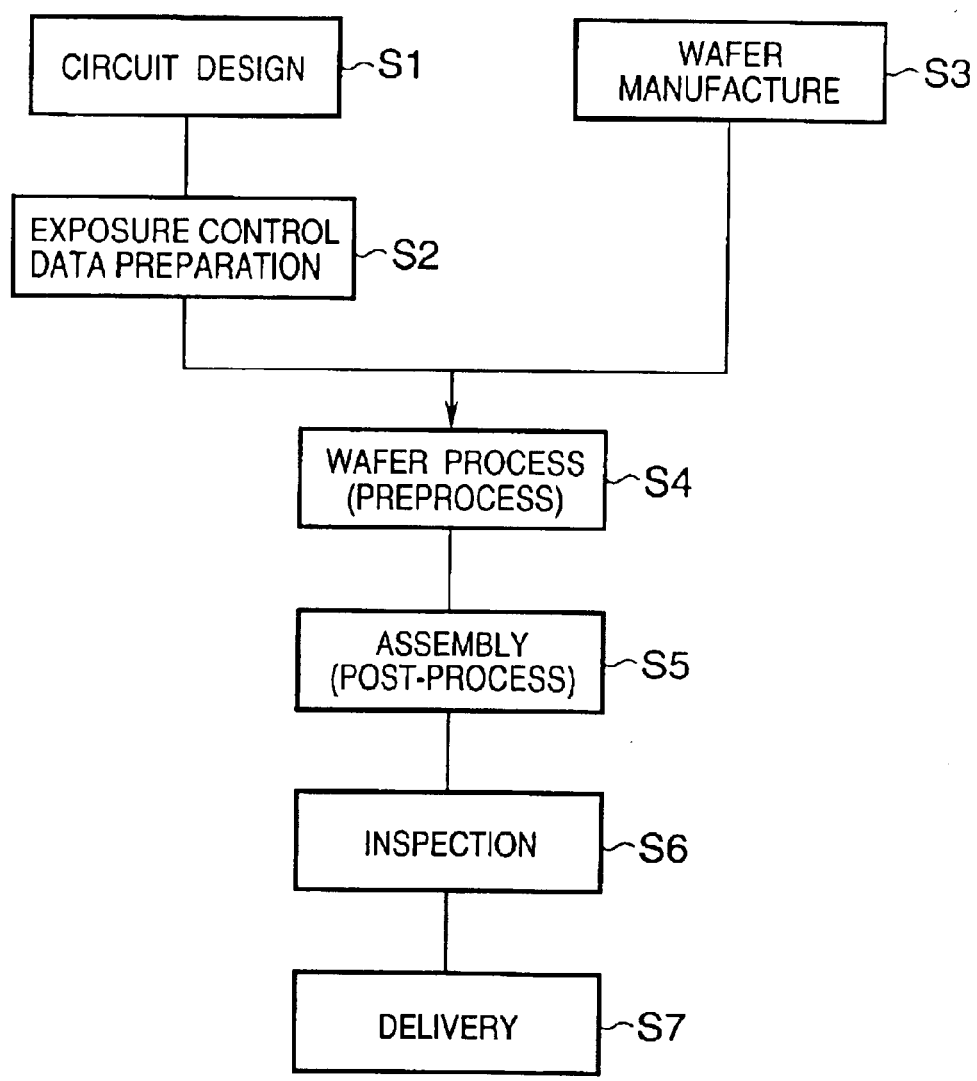
FIG. 15 is a flow chart for explaining a microdevice manufacturing flow to which the exposure apparatus and method of the present invention are applied.

An embodiment of the device manufacturing method using the above-described electron beam exposure apparatus will be described. FIG. 15 shows the flow of manufacturing a microdevice (e.g., a semiconductor chip such as an IC or an LSI, a liquid crystal panel, a CCD, a thin-film magnetic head, or a micromachine). In step 1 (circuit design), the circuit of a semiconductor device is designed. In step 2 (exposure control data preparation), exposure control data for the exposure apparatus is prepared on the basis of the designed circuit pattern. In step 3 (wafer manufacture), a wafer is manufactured using a material such as silicon. In step 4 (wafer process) called a preprocess, an actual circuit is formed on the wafer by lithography using the wafer and the exposure apparatus to which the exposure control data is input. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

Figure 16:
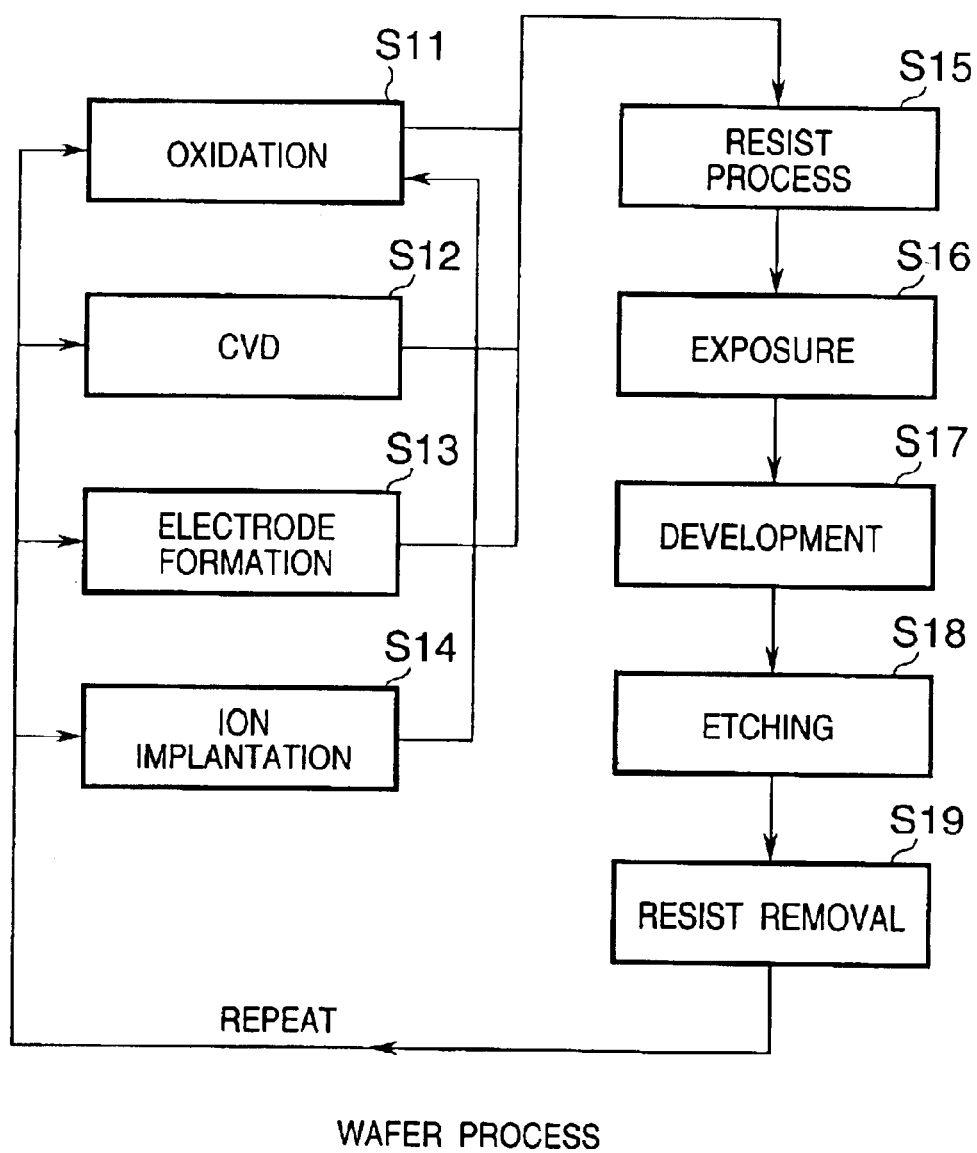
FIG. 16 is a flow chart for explaining a wafer process to which the exposure apparatus and method of the present invention are applied.

FIG. 16 shows a detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive material is applied to the wafer. In step 16 (exposure), the circuit pattern is printed on the wafer by exposure using the above-described exposure apparatus. In step 17 (development), the exposed wafer is developed. In step 18 (etching), portions other than the developed resist image are etched. In step 19 (resist peeling), the unnecessary resist remaining after etching is removed. By repeating these steps, a multilayered structure of circuit patterns is formed on the wafer.

When the manufacturing method of this embodiment is used, a device with a high degree of integration, which is conventionally difficult to manufacture, can be manufactured at low cost.

The present invention is not limited to the above embodiments and various changes and modifications can be made within the spirit and scope of the present invention. Therefore, to apprise the public of the scope of the present invention, the following claims are made.

What is claimed is:

1. An exposure method of drawing a pattern on a substrate using a charged particle beam, the method comprising:

a detection step of placing a calibration substrate having a plurality of marks on a stage and detecting positions of the plurality of marks in a first direction, substantially parallel to a surface of the calibration substrate, by a first position detection section using the charged particle beam, and detecting the positions of the plurality of marks in the first direction by a second position detection section using light, while adjusting a position of the stage; and a correction step of correcting a position where the charged particle beam is incident on the substrate on which the pattern is to be drawn in drawing, in accordance with the position of the stage on the basis of the difference between first detection results by the first position detection section and second detection results by the second position detection section.

2. The method according to claim 1, wherein the charged particle beam used in the detection step and the charged particle beam for drawing the pattern on the substrate on which the pattern is to be drawn are generated by the same electron optical system.

3. The method according to claim 2, wherein said method further comprises the determination step of detecting a position of a reference mark formed on the stage by the first position detection section using the charged particle beam and the second position detection section using the light to determine the positional relationship between a reference position of the first position detection section and a reference position of the second position detection section, and the correction step comprises correcting a reference position of the charged particle beam in accordance with the position of the stage on the basis of the difference between the detection results by the charged particle beam and the light in the detection step such that the positional relationship between the reference position of the charged particle beam incident on the substrate on which the pattern is to be drawn in drawing and the reference position of the second position detection section matches the positional relationship between the reference position of the first position detection section and the reference position of the second position detection section.

4. The method according to claim 1, wherein the correction step comprises obtaining, on the basis of the position of the stage and the detection result by the charged particle beam and that by the light, the relationship between the position of the stage and a shift of the position where the charged particle beam is incident on the substrate from a target position and correcting the position where the charged particle beam is incident on the substrate on which the pattern is to be drawn in drawing, on the basis of the relationship in accordance with the position of the stage.

5. The method according to claim 1, wherein the correction step comprises controlling a deflector for deflecting the charged particle beam to correct the position where the charged particle beam is incident on the substrate on which the pattern is to be drawn in drawing.

6. The method according to claim 1, wherein the correction step comprises controlling the position of the stage to correct the position where the charged particle beam is incident on the substrate on which the pattern is to be drawn in drawing.

7. The method according to claim 1, wherein the correction step comprises correcting a shift of the position where the charged particle beam is incident on the substrate on which the pattern is to be drawn, the shift being generated in accordance with the position of the stage.

8. The method according to claim 1, wherein the correction step comprises correcting a reference position of the charged particle beam on the substrate in accordance with the position of the stage to correct the position where the charged particle beam is incident on the substrate on which the pattern is to be drawn in drawing.

9. The method according to claim 8, wherein the reference position is a position where the charged particle beam is incident on the substrate on which the pattern is to be drawn without being deflected by a deflector.

10. The method according to claim 1, wherein said method further comprises the drawing step of drawing the pattern in each of a plurality of shot regions on the substrate on which the pattern is to be drawn, and the correction step comprises continuously correcting the position where the charged particle beam is incident on the substrate on which the pattern is to be drawn, in accordance with the position of the stage while the pattern is being drawn in each shot region.

11. The method according to claim 1, wherein said method further comprises the drawing step of drawing the pattern in each of a plurality of shot regions on the substrate on which the pattern is to be drawn while moving the stage to switch the shot region where the pattern is to be drawn, and the correction step comprises correcting the position where the charged particle beam is incident on the substrate on which the pattern is to be drawn, in accordance with a position of the shot region where the pattern is to be drawn.

12. The method according to claim 1, wherein the stage contains a magnetic material.

13. The method according to claim 1, wherein the stage is supported by static pressure bearings and a preloading mechanism.

14. The method according to claim 13, wherein the preloading mechanism comprises a magnetic preloading mechanism.

15. The method according to claim 13, wherein the preloading mechanism comprises a vacuum preloading mechanism.

16. The method according to claim 13, wherein the preloading mechanism comprises an electrostatic preloading mechanism.

17. The method according to claim 1, wherein the charged particle beam is an electron beam.

18. An exposure apparatus for drawing a pattern on a substrate using a charged particle beam, the apparatus comprising:

a stage which moves while having the substrate placed on said stage;

an electron optical system having a function of drawing the pattern on the substrate using the charged particle beam and a function of irradiating a mark with the charged particle beam and detecting a position of the mark on the basis of the charged particle beam from the mark;

an alignment optical system for irradiating a mark with light and detecting a position of the mark based on the light from the mark; and a control section, said control section controlling processing including:

(i) a detection step of placing a calibration substrate having a plurality of marks on said stage, detecting positions of the plurality of marks in a first direction, substantially parallel to a surface of the calibration substrate, by said electron optical system and detecting the positions of the plurality of marks in the first direction by said alignment optical system, while adjusting a position of said stage; and (ii) a correction step of correcting a position where the charged particle beam is incident on the substrate on which the pattern is to be drawn in the drawing, in accordance with the position of said stage on the basis of the difference between first detection results obtained in the detection step by said electron optical system and second detection results obtained in the detection step by said alignment optical system.

19. A device manufacturing method comprising the steps of:

placing a calibration substrate having a plurality of marks on a stage, detecting positions of the plurality of marks in a first direction, substantially parallel to a surface of the calibration substrate, by a first position detection section using a charged particle beam and detecting the positions of the plurality of marks in the first direction by a second position detection section using light, while adjusting a position of the stage;

drawing a pattern on a substrate on which the pattern is to be drawn using the charged particle beam while correcting a position where the charged particle beam is incident on the substrate in drawing, in accordance with the position of the stage on the basis of the difference between first detection results by the first position detection section and second detection results by the second position detection section; and developing the substrate on which the pattern is drawn.

20. An apparatus for performing patterning by irradiating a substrate with a charged particle beam, the apparatus comprising:

a substrate stage arranged to move in a direction substantially parallel to a surface of the substrate;

a first detector arranged to detect positions, in the direction, of the plurality of marks on said substrate stage by using the charged particle beam;

a second detector arranged to detect the positions, in the direction, of the plurality of marks by using light; and a memory arranged to store information indicating a relationship between first detection results by said first detector and second detection results by said second detector in accordance with a position of said substrate stage.

21. The apparatus according to claim 20, further comprising a controller arranged to correct a position where the charged particle beam is incident on the substrate based on the information stored in said memory.

22. The apparatus according to claim 20, wherein said substrate stage comprises a magnetic material and the information to be stored in said memory comprises shift amounts of the charged particle beam associated with a movement of said substrate stage.

23. The apparatus according to claim 20, wherein said second detector is arranged to detect images of the marks.

24. A device manufacturing method comprising:

performing patterning on a substrate using an apparatus defined in claim 20; and developing the substrate subjected to the patterning.

* * * * *

UNITED STATES PATENT AND TRADEMARK OFFICE
CERTIFICATE OF CORRECTION

PATENT NO. : 6,864,488 B2
DATED : March 8, 2005
INVENTOR(S) : Masato Muraki

It is certified that error appears in the above-identified patent and that said Letters Patent is hereby corrected as shown below:

Column 4,
Line 34, "present" should read -- of the present --.

Column 5,
Line 14, "drawn" should read -- drawn. --.

Column 6,
Line 7, "aspect," should read -- aspect --.

Column 14,
Line 2, "in-the" should read -- in the --.

Column 17,
Line 58, "mechanis" should read -- mechanism --.
Line 65, "FIGS. 10A," should read -- FIG. 10A, --.

Column 19,
Line 41, "system 14 The" should read -- system 14. The --.

Signed and Sealed this

Ninth Day of August, 2005

JON W. DUDAS
*Director of the United States Patent and Trademark Office*